US012648285B2

(12) United States Patent
Dong et al.

(10) Patent No.: US 12,648,285 B2
(45) Date of Patent: Jun. 2, 2026

(54) DRIVING BACKPLANE, LIGHT-EMITTING BASE PLATE, DISPLAY PANEL, AND DISPLAY APPARATUS

(71) Applicant: BOE TECHNOLOGY GROUP CO., LTD., Beijing (CN)

(72) Inventors: Xue Dong, Beijing (CN); Feng Guan, Beijing (CN); Guangcai Yuan, Beijing (CN); Ce Ning, Beijing (CN); Minghua Xuan, Beijing (CN); Haoliang Zheng, Beijing (CN); Fei Wang, Beijing (CN); Jianhua Du, Beijing (CN); Yang Lv, Beijing (CN); Chaolu Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/862,628

(22) PCT Filed: Mar. 31, 2023

(86) PCT No.: PCT/CN2023/085596
§ 371 (c)(1),
(2) Date: Nov. 4, 2024

(87) PCT Pub. No.: WO2024/197852
PCT Pub. Date: Oct. 3, 2024

(65) Prior Publication Data
US 2025/0280640 A1      Sep. 4, 2025

(51) Int. Cl.
*H01L 27/12*          (2006.01)
*G09G 3/32*          (2016.01)
(Continued)

(52) U.S. Cl.
CPC ............... *H10H 29/49* (2025.01); *G09G 3/32* (2013.01); *H10H 29/32* (2025.01)

(58) Field of Classification Search
CPC .......... H10H 29/49; H10H 29/32; G09G 3/32; H10D 86/00; H10K 59/131
See application file for complete search history.

(56) References Cited

U.S. PATENT DOCUMENTS

2024/0006570 A1* 1/2024 Lee ...................... H10K 59/131
2024/0096905 A1* 3/2024 Fan ........................ H10D 86/00

FOREIGN PATENT DOCUMENTS

CN          101145564 A      3/2008
CN          109904080 A      6/2019
(Continued)

OTHER PUBLICATIONS

International Search Report of PCT application No. PCT/CN2023/085596 dated Dec. 26, 2023.
(Continued)

*Primary Examiner* — Abdul-Samad A Adediran
(74) *Attorney, Agent, or Firm* — Calfee, Halter & Griswold LLP

(57) ABSTRACT

A driving backplane includes a first substrate, a thick copper layer, a second substrate, and a driving layer stacked in sequence. The thick copper layer is provided with a driving wire configured to load a driving signal. The driving layer is provided with a driving circuit. The driving circuit is electrically connected to the driving wire through a via.

19 Claims, 32 Drawing Sheets

(51) Int. Cl.
    *H10H 29/32*      (2025.01)
    *H10H 29/49*      (2025.01)

(56)          References Cited

FOREIGN PATENT DOCUMENTS

| CN | 209545726 U | 10/2019 | |
| CN | 111524904 A | 8/2020 | |
| WO | 2021203415 A1 | 10/2021 | |
| WO | WO2023133718 | * 12/2022 | ............ H10D 86/00 |

OTHER PUBLICATIONS

Written Opinion of PCT application No. PCT/CN2023/085596 dated Dec. 26, 2023.

* cited by examiner

VDD

VDD

PRA
SCLAx
BPX
BPG

DRIVING BACKPLANE, LIGHT-EMITTING BASE PLATE, DISPLAY PANEL, AND DISPLAY APPARATUS

CROSS-REFERENCE TO RELATED APPLICATION

The present application is the U.S. National Stage of International Application No. PCT/CN2023/085596, filed on Mar. 31, 2023, the contents of which are incorporated herein by reference in their entireties for all purposes.

TECHNICAL FIELD

The present disclosure relates to the field of display technologies, and specifically, to a driving backplane, a light-emitting base plate, a display panel, and a display apparatus.

BACKGROUND

Micro light-emitting diodes (Micro LEDs) have characteristics of small size, high integration, and self-luminescence, etc. Compared with display technologies such as liquid crystal display (LCD) devices and organic light-emitting display (OLED) devices, Micro LED direct display has greater advantages in brightness, resolution, contrast, energy consumption, service life, response speed, and thermal stability, etc.

In a Micro LED display panel, a thick copper layer is generally provided. The thick copper layer may be configured to form a signal wire to reduce a voltage drop of a driving signal. The thick copper layer is typically disposed on an upper side of a thin film transistor, which will have a large impact on a subsequent preparation process of the display panel.

It should be noted that the information disclosed in the above background section is only used for enhancement of understanding in the background of the present disclosure, and thus may include information that does not constitute the prior art known to those ordinary skilled in the art.

SUMMARY

An object of the present disclosure is to overcome the deficiencies of the prior art described above, provide a driving backplane, a light-emitting base plate, a display panel, and a display apparatus, and improve a preparation yield rate of the driving backplane.

According to a first aspect of the present disclosure, there is provided a driving backplane, including a first substrate, a thick copper layer, a second substrate, and a driving layer stacked in sequence; where the thick copper layer is provided with a driving wire configured to load a driving signal; the driving layer is provided with a driving circuit; and the driving circuit is electrically connected to the driving wire through a via.

According to an embodiment of the present disclosure, the second substrate includes a second polyimide layer covering the thick copper layer, and a second inorganic barrier layer disposed on a side of the second polyimide layer away from the first substrate.

According to an embodiment of the present disclosure, a thickness of the second polyimide layer is greater than a thickness of the thick copper layer.

According to an embodiment of the present disclosure, the thickness of the thick copper layer is in a range of 0.2~20 microns.

According to an embodiment of the present disclosure, the first substrate includes a first polyimide layer and a first inorganic barrier layer arranged in a stacking manner, and the thick copper layer is disposed on a surface of the first inorganic barrier layer away from the first polyimide layer.

According to an embodiment of the present disclosure, the driving layer includes a transistor layer, an interlayer dielectric layer and a source-drain metal layer stacked in sequence on a side of the second substrate away from the first substrate; and the source-drain metal layer is electrically connected, through a via, to the thick copper layer in a direct manner or an indirect manner.

According to an embodiment of the present disclosure, the driving wire includes a driving voltage wire configured to load a driving voltage, and a reference voltage wire configured to load a reference voltage;

the source-drain metal layer is provided with a first device pad, a second device pad, a first connection structure, and a second connection structure; and the driving circuit is electrically connected to the first connection structure, and the first connection structure is electrically connected to the driving voltage wire; the first device pad is electrically connected to an output end of the driving circuit; and the second device pad is electrically connected to the second connection structure, and the second connection structure is electrically connected to the reference voltage wire.

According to an embodiment of the present disclosure, the transistor layer includes transistors; at least a portion of the transistors is provided with a top gate and a bottom gate; and the top gate and the bottom gate of the transistor are electrically connected to each other through the source-drain metal layer.

According to an embodiment of the present disclosure, the driving backplane is provided with an adapter pad between the source-drain metal layer and the thick copper layer; a first portion of the adapter pad is electrically connected to the thick copper layer through a via; and a second portion of the adapter pad is electrically connected to the source-drain metal layer through a via.

According to an embodiment of the present disclosure, the driving backplane further includes an adapter layer and a third inorganic barrier layer stacked in sequence on the side of the second substrate away from the first substrate; and the transistor layer is disposed on a side of the third inorganic barrier layer away from the first substrate; and the adapter pad is provided in the adapter layer.

According to an embodiment of the present disclosure, the transistor layer includes a semiconductor layer; and the semiconductor layer includes channel structures and semiconductor conductive structures; and at least partial ones of the channel structures are electrically connected to each other through the semiconductor conductive structure; and at least a portion of the semiconductor conductive structures is connected to the source-drain metal layer through a via.

According to an embodiment of the present disclosure, the transistor layer includes a semiconductor layer; and the semiconductor layer includes semiconductor structures and metal conductive structures; and the semiconductor structures include channel structures, at least partial ones of the channel structures are electrically connected to each other through the metal conductive structure.

According to an embodiment of the present disclosure, at least a portion of the semiconductor structures includes a channel structure and lap connection structures disposed on two sides of the channel structure; and the lap connection structure is connected to the metal conductive structure in a lapped manner.

According to an embodiment of the present disclosure, at least a portion of the metal conductive structures is connected to the source-drain metal layer through a via.

According to an embodiment of the present disclosure, the semiconductor layer is composed of the semiconductor structures and the metal conductive structures; any one of the semiconductor structures is composed of a channel structure and lap connection structures disposed on two side of the channel structure; and the lap connection structure is connected to the metal conductive structure in a lapped manner; and the metal conductive structure is configured to enable an electrical connection between the channel structures, and is configured to be connected to the source-drain metal layer through a via.

According to an embodiment of the present disclosure, the driving backplane includes a display area and a peripheral area located on at least one side of the display area; and the thick copper layer is not provided in the peripheral area.

According to an embodiment of the present disclosure, the driving backplane further includes a support substrate, the first substrate is disposed on a side of the support substrate away from the peripheral area, and the support substrate is not provided in at least a partial region of the peripheral area.

According to an embodiment of the present disclosure, the support substrate is not provided in the peripheral area; and the peripheral area is capable of bending to a back surface of the driving backplane.

According to an embodiment of the present disclosure, the source-drain metal layer is provided with a binding pad and a connection wire; the binding pad is disposed in the peripheral area; and the connection wire is electrically connected to the binding pad and extends to the display area, and is electrically connected to the thick copper layer through a via.

According to a second aspect of the present disclosure, there is provided a light-emitting base plate, including the driving backplane described above and an electronic element; where the electronic element is electrically connected to the driving layer of the driving backplane; and the electronic element includes a light-emitting element.

According to an embodiment of the present disclosure, the light-emitting element includes a Mini LED or a Micro LED.

According to a third aspect of the present disclosure, there is provided a display panel, including the driving backplane described above and a light-emitting element, where the light-emitting element is electrically connected to the driving layer of the driving backplane.

According to a fourth aspect of the present disclosure, there is provided a display apparatus, including the light-emitting base plate described above, or including the display panel described above.

It should be understood that the above general description and the subsequent detailed description are exemplary and explanatory only, and do not limit the present disclosure.

BRIEF DESCRIPTION OF THE DRAWINGS

The accompanying drawings herein, which are incorporated into and form a part of the specification, illustrate embodiments consistent with the present disclosure and are used in conjunction with the specification to explain the principles of the present disclosure. It is apparent that the accompanying drawings in the following description are only some of the embodiments of the present disclosure, and that other accompanying drawings can be obtained based on these accompanying drawings without creative labor for those ordinary skilled in the art.

FIG. 28-1 is a schematic partial top view of a metal conductive structure in the embodiment described in FIG. 27.

FIG. 28-2 is a schematic partial top view of a semiconductor structure in the embodiment described in FIG. 27.

FIG. 28-3 is a schematic partial cross-sectional diagram of a semiconductor layer in the embodiment described in FIG. 27.

DETAILED DESCRIPTION

Figure 1:
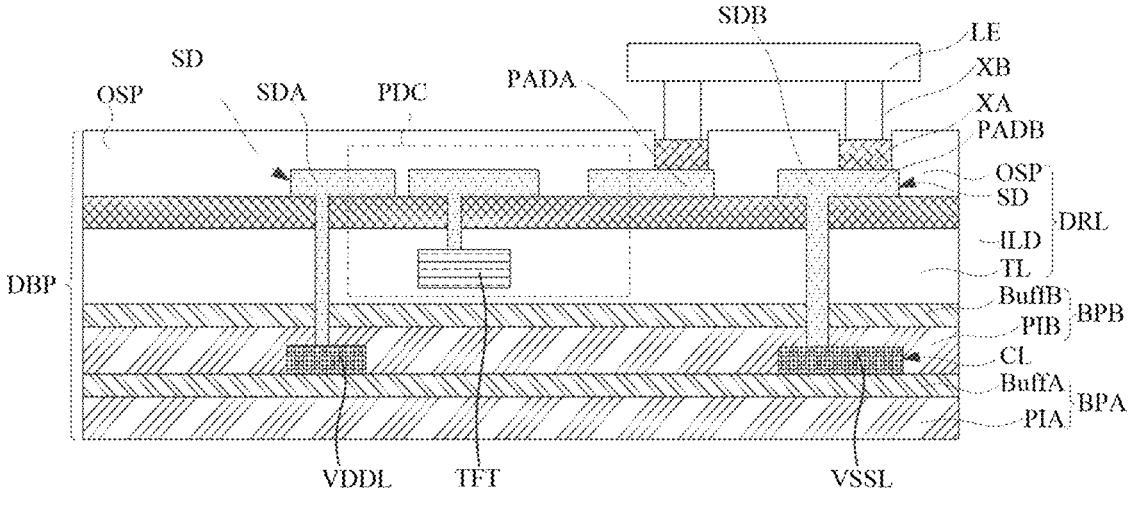
FIG. 1 is a schematic diagram of a structure of a light-emitting base plate in an embodiment of the present disclosure.

Exemplary embodiments are now described more comprehensively with reference to the accompanying drawings. However, the exemplary embodiments are capable of being implemented in a variety of forms, and should not be construed as being limited to the embodiments set forth herein. Rather, the provision of these embodiments allows for the present disclosure to be comprehensive and complete, and conveys the idea of the exemplary embodiments in a comprehensive manner to those skilled in the art. The same reference numerals in the drawings indicate the same or similar structures, and therefore their detailed descriptions will be omitted. In addition, the accompanying drawings are only schematic illustrations of the present disclosure, and are not necessarily drawn to scale.

Although relative terms such as "up" and "down" are used in this specification to describe a relative relationship between one component and another component indicated in the drawings, these terms are used in this specification only for convenience, e.g., in accordance with the direction of the example described in the accompanying drawing. It can be understood that if the device indicated in the drawing is flipped upside down, the component described as being "up" will become the component described as being "down". When a certain structure is "on" another structure, it may mean that the certain structure is integrally formed on the another structure, or that the certain structure is "directly" arranged on the another structure, or that the certain structure is "indirectly" arranged on the another structure through yet another structure.

The terms "a", "an", "the", "said", and "at least one" are used for indicating an existence of one or more elements/components/etc.; and the terms "include" and "have" are used for indicating an open-ended inclusion and mean that there may be additional elements/components/etc. in addition to the listed elements/components/etc. The terms "first", "second" and "third", etc. are used merely as markers but not as quantitative limitations to the objects thereof.

A transistor refers to an element that at least includes three terminals, namely a gate, a drain and a source. The transistor is provided with a channel region between the drain (drain electrode terminal, drain region or drain electrode) and the source (source electrode terminal, source region or source electrode), and a current can flow through the drain, the channel region and the source. The channel region refers to the region where the current mainly flows through.

A Micro LED direct display technology refers to a display technology that uses a self-luminescence Micro LED at a micrometer level as a sub-pixel and assembles it onto a driving panel to form a high-density Micro LED array. The Micro LED generally requires a large driving current, so the driving backplane is generally provided with a thick copper layer to reduce a voltage drop and power consumption of a driving wire.

In related arts, the thick copper layer is formed on a side of a transistor layer away from the substrate. After the formation of the thick copper layer, a significant segment difference will be formed on a surface of the driving backplane, which has a negative impact on a subsequent process of the driving backplane. Moreover, since the thick copper layer is formed after the transistor layer, film layer quality and preparation difficulty of the thick copper layer are also affected by a process of the previous layer, especially the uniformity of the thick copper layer is greatly affected.

An embodiment of the present provides a light-emitting base plate. Referring to FIG. 1, the light-emitting base plate includes a driving backplane DBP and electronic elements bound to a surface of the driving backplane DBP. These electronic elements at least include a light-emitting element LE. The light-emitting element LE may emit light under driving of the driving backplane DBP. Optionally, the light-emitting element LE may be a Micro LED (micro light-emitting diode) or a Mini LED (mini light-emitting diode). Of course, the light-emitting element LE may also be other self-luminescence electronic elements, such as organic electroluminescent diodes and quantum dot light-emitting diodes, subject to the light-emitting element LE being capable of being bound to the surface of the driving backplane DBP and emitting light in a controlled manner.

Optionally, the size of the Mini LED may be not greater than 1 millimeter, especially not greater than 400 micrometers. Furthermore, a luminescence area of the Mini LED may be less than 1 mm$^2$, especially less than 10000 μm$^2$, and further may be less than 3000 μm$^2$.

Optionally, the size of the Micro LED may be not greater than 300 microns, especially not greater than 80 microns. In this way, when the light-emitting element LE is a Micro LED, the light-emitting base plate can have a high resolution.

In an embodiment of the present disclosure, the light-emitting base plate may be used as a lighting board, a car light board, an ambient light board, a backlight board for a liquid crystal display apparatus, or a backlight board for a billboard, or may be directly as a display panel. Of course, the light-emitting base plate in the embodiments of the present disclosure is not limited to the above-described uses or types, subject to being capable of emitting light, displaying, or providing a light source.

In an example, each of the light-emitting elements LE is capable of independently emitting light in a controlled manner under the driving of the driving backplane DBP, enabling the light-emitting base plate to serve as a display panel and thus be capable of achieving direct display. At this point, each of the light-emitting elements LE may serve as a sub-pixel of the light-emitting base plate. Furthermore, the light-emitting element LE is a Micro LED, which enables the light-emitting base plate to have a high resolution.

Optionally, the light-emitting base plate may be provided with a plurality of light-emitting elements LE having different colors, for example, a red light-emitting element LE, a green light-emitting element LE and a blue light-emitting element LE are provided, which enables the light-emitting base plate to emit color light or achieve color display.

It can be understood that in some embodiments, the electronic elements bound to the surface of the driving backplane DBP may also include other elements, such as one or more of the following: photoelectric sensors, temperature sensors, micro driving chips.

The embodiments of the present disclosure also provide a display apparatus. The display apparatus may include the light-emitting base plate described above. In an example, the display apparatus is a liquid crystal display apparatus, and the light-emitting base plate may serve as a backlight board of the liquid crystal display apparatus. In another example, the display apparatus may be a Micro LED display apparatus or a Mini LED display apparatus, and the light-emitting base plate serves as a direct display panel of the display apparatus. Optionally, the display apparatus may be a smartphone screen, a smartwatch screen, a television screen, an advertising screen, or other type of display apparatus.

Referring to FIG. 1, the driving backplane DBP includes a first substrate BPA, a thick copper layer CL, a second substrate BPB, and a driving layer DRL that are stacked in sequence. The electronic element is electrically connected to the driving layer DRL. In some embodiments, the driving layer DRL is provided with a driving circuit PDC configured to drive the light-emitting element LE, and the thick copper layer CL is provided with a driving wire configured to load a driving signal to the driving circuit PDC. The driving layer DRL is electrically connected, through a via, to the thick copper layer CL in a direct manner or an indirect manner, enabling the driving signal to be capable of being loaded to the driving circuit PDC.

In an embodiment of the present disclosure, referring to FIG. 1, the driving layer DRL may include a transistor layer TL, an interlayer dielectric layer ILD and a source-drain metal layer SD that are arranged in sequence on a side of the second substrate BPB away from the first substrate BPA. In some embodiments, the transistor layer TL is provided with transistors TFT required for the driving circuit PDC. When the driving circuit PDC is provided with a storage capacitor, at least a partial electrode plate of the storage capacitor may also be provided in the transistor layer TL. Of course, if necessary, a partial electrode plate of the storage capacitor may also be provided in the source-drain metal layer SD. The devices of the driving circuit PDC, such as the transistor TFT and the storage capacitor, are electrically connected to each other through conductive structures located in the transistor layer TL and the source-drain metal layer SD, thereby forming the required electrical connection relationship.

In an embodiment of the present disclosure, the host material of the thick copper layer CL is copper, and the thick copper layer has a large thickness to enable it to have a small square resistance. The driving wire provided by the thick copper layer CL is a wire that can load the driving signal to a plurality of driving circuits PDC or a plurality of light-emitting elements LE. At this point, the distribution area of the driving signal spans the area where a plurality of sub-pixels are located, and spans a long distance. Since the thick copper layer CL uses a thick copper process, the impedance of the driving wire is low, which can avoid the problems of a large voltage drop of the driving signal and high power consumption of the driving wire caused by the excessive length of the driving wire.

In this embodiment, the thick copper layer CL is disposed on a surface of the first substrate BPA, so the thick copper layer CL is formed on a flat surface, avoiding the problem of an insufficient thickness uniformity of the thick copper layer CL caused by insufficient surface flatness. In addition, when the thick copper layer CL is formed, no other conductive structures have been formed on the first substrate BPA or relatively few conductive structures have been formed on the first substrate BPA; and the thick copper layer CL is prepared before the driving layer DRL, so the preparation process of the thick copper layer CL does not affect the electrical performance of the driving layer DRL. On the one hand, this can avoid the influence of the preparation process of the thick copper layer CL on the performance of the driving layer DRL, and on the other hand, this can make the process that can be used for the thick copper layer CL freer and more flexible, which is conducive to optimizing the process more flexibly to prepare thick copper layers CL with a greater thickness, a better uniformity, and a lower cost.

In this embodiment, the second substrate BPB covers the thick copper layer CL, and the driving layer DRL is disposed on a side of the second substrate BPB away from the thick copper layer CL. Although the thick copper layer CL has a large thickness and has a large segment difference, the second substrate BPB can block the conduction of the segment difference to the subsequent film layers, i.e., provide a flat surface for the subsequent preparation of the driving layer DRL. In other words, the surface unevenness caused by the large thickness and large segment difference of the thick copper layer CL is not transmitted to the transistor layer TL, which can reduce the difficulty of preparing the transistor layer TL and optimize the morphology and size of each of the film layers of the transistor layer TL.

Therefore, the light-emitting base plate and the driving backplane DBP provided in the embodiments of the present disclosure can reduce the difficulty of preparing the driving backplane DBP, thereby facilitating the improvement of the yield rate of the driving backplane DBP and the light-emitting base plate.

As follows, the structure, principle and effect of the driving backplane DBP in the embodiments of the present disclosure are further explained and illustrated in conjunction with the accompanying drawings.

In an embodiment of the present disclosure, referring to FIG. 1, the driving circuit PDC is electrically connected to the thick copper layer CL through the source-drain metal layer SD, enabling the driving signal on the thick copper layer CL to be loaded to the driving circuit PDC. Optionally, the thickness of the thick copper layer CL may be greater than the thickness of the source-drain metal layer SD. Further, the host material of the thick copper layer CL includes copper.

In an embodiment of the present disclosure, referring to FIG. 1, the source-drain metal layer SD is further formed with device pads for binding the light-emitting element LE, and the light-emitting element LE is bound and connected to the device pads. For example, a pin of the light-emitting element LE is electrically connected to the device pad through a conductive connection structure XB.

Optionally, the conductive connection structure XB is a solder paste, so the electrical connection between the light-emitting element LE and the device pad may be accomplished through processes such as coating the solder paste (e.g., printing the solder paste), mounting the light-emitting element LE (die bonding), and solder reflowing. It can be understood that the conductive connection structure may also be made of other structures or materials, for example, in some other embodiments, the conductive connection structure may also be a conductive adhesive, or a concave-convex structure with a spike-like shape composed of a hard metal.

Optionally, the light-emitting element LE is provided with an anode pin and a cathode pin. Referring to FIG. 1, the device pads include a first device pad PADA configured to be connected to the anode pin of the light-emitting element LE, and a second device pad PADB configured to be connected to the cathode pin of the light-emitting element LE. In some embodiments, one of the first device pad PADA and the second device pad PADB is connected to the driving circuit PDC, and another one of the first device pad PADA and the second device pad PADB is electrically connected to the driving wire provided in the thick copper layer CL. The driving circuit PDC may control whether the connected light-emitting element LE is in an electrical pathway, and the state (e.g., the magnitude of the driving current, the duration of the driving current, etc.) of the electrical pathway in which the light-emitting element LE is located, thereby controlling the luminescence state of the light-emitting element LE.

As an example, referring to FIG. 1, the driving wire on the thick copper layer CL includes a driving voltage wire VDDL configured to load a driving voltage VDD, and a reference voltage wire VSSL configured to load a reference voltage VSS; and the source-drain metal layer SD is provided with a first connection structure SDA, a second connection structure SDB, a first device pad PADA, and a second device pad PADB. The driving circuit PDC is electrically connected to the driving voltage wire VDDL through the first connection structure SDA, enabling the driving voltage VDD to be loaded to the driving circuit PDC. The first device pad PADA is electrically connected to an output end of the driving circuit PDC, enabling the driving current provided by the driving circuit PDC to be loaded to the first device pad PADA. The second device pad PADB is electrically connected to the reference voltage wire VSSL through the second connection structure SDB, enabling the driving current that flows to the second device pad PADB from the light-emitting element LE to flow to the reference voltage wire VSSL. When the driving circuit PDC is conducted, the light-emitting element LE is in the electrical pathway and thus emits light under the control of the driving current provided by the driving circuit PDC.

In this example, second connection structures SDB of different driving circuits PDC may each be electrically connected to the reference voltage wire VSSL independently through a via, and at this point, adjacent second device pads PADB are not electrically connected to each other through the structure located in the source-drain metal layer SD. In other examples of the present disclosure, at least partial second connection structures SDB may be electrically connected to each other through the conductive structure located in the source-drain metal layer SD, and electrically connected to the reference voltage wire VSSL. For example, second connection structures SDB provided in the same column may be interconnected into a reference voltage auxiliary wire located in the source-drain metal layer SD; further, the second device pad PADB may be a localized region on this reference voltage auxiliary wire. In this way, the conductive structure (e.g., the reference voltage auxiliary wire) that enables the second device pads PADB to be electrically connected to each other may be provided in parallel with the reference voltage wire VSSL, which may further reduce the voltage drop and impedance when the reference voltage VSS is in distribution, and reduce the power consumption of the reference voltage wire VSSL.

In this example, first connection structures SDA of different driving circuits PDC may each be electrically connected to the driving voltage wire VDDL independently through a via. In other examples of the present disclosure, at least partial first connection structures SDA may be electrically connected to each other through the conductive structure located in the source-drain metal layer SD, and electrically connected to the driving voltage wire VDDL. For example, first connection structures SDA provided in the same column may be interconnected into a driving voltage auxiliary wire located in the source-drain metal layer SD. In this way, the conductive structure (e.g., the driving voltage auxiliary wire) that enables the driving circuits PDC to be electrically connected to each other may be provided in parallel with the driving voltage wire VDDL, which may further reduce the voltage drop and impedance when driving voltage VDD is in distribution, and reduce the power consumption of the driving voltage wire VDDL.

In the above example, the first device pad PADA is electrically connected to the driving circuit PDC, and the second device pad PADB is electrically connected to the reference voltage wire VSSL. It can be understood that in some other examples of the present disclosure, the second device pad PADB may be electrically connected to the output end of the driving circuit PDC, the first device pad PADA may be electrically connected to the driving voltage sire VDDL through the first connection structure SDA, and the driving circuit PDC may be electrically connected to the reference voltage wire VSSL through the first connection structure SDA.

Figure 2:
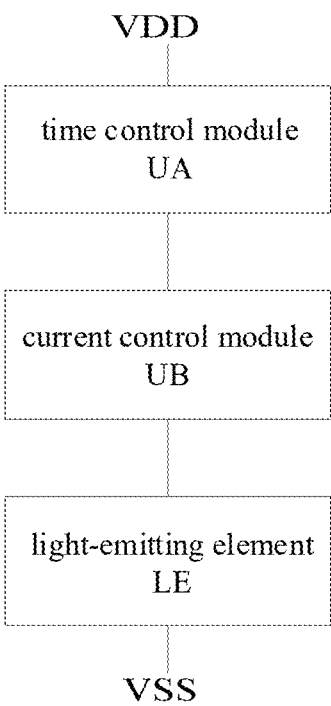
FIG. 2 is a schematic diagram of a principle of driving a light-emitting element by a driving circuit in an embodiment of the present disclosure.
Figure 3:
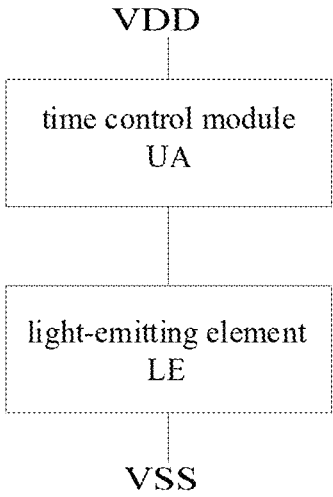
FIG. 3 is a schematic diagram of a principle of driving a light-emitting element by a driving circuit in an embodiment of the present disclosure.
Figure 4:
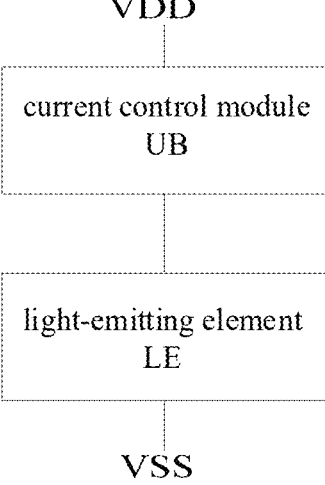
FIG. 4 is a schematic diagram of a principle of driving a light-emitting element by a driving circuit in an embodiment of the present disclosure.

In the embodiments of the present disclosure, the driving circuit PDC may adopt different architectures as needed, whichever enables the achievement of driving the light-emitting element LE. By way of example, in the example of FIG. 2, the driving circuit PDC may include a time control module UA and a current control module UB connected in series, where the time control module UA is configured to control a total length of time for which the driving circuit PDC is conducted, and the current control module UB is configured to control a magnitude of the driving current provided by the driving circuit PDC when it is conducted. When the driving circuit PDC is in operation, the control of the luminescence brightness of the light-emitting element LE may be achieved by controlling one or both of the magnitude of the driving current and the total length of time for conduction. For example, in the case of a low gray level display, the driving current when the driving circuit PDC is conducted is constant, and the luminescence brightness of the light-emitting element LE is controlled by controlling the total length of time for which the driving circuit PDC is conducted; in the case of a high gray level display, the total length of time for which the driving circuit PDC is conducted is constant, and the luminescence brightness of the light-emitting element LE is controlled by controlling the magnitude of the driving current. By way of further example, in the example of FIG. 3, the driving circuit PDC may include only the time control module UA. In this example, the magnitude of the driving current provided by the driving circuit PDC when it is conducted may be constant; and the luminescence brightness of the light-emitting element LE is controlled by controlling the total length of time for which the driving circuit PDC is conducted. By way of further example, in the example of FIG. 4, the driving circuit PDC may include only the current control module UB. In this example, the total length of time for which the driving circuit PDC is conducted each time may be constant; and the luminescence brightness of the light-emitting element LE is controlled by controlling the magnitude of the driving current when the driving circuit PDC is conducted.

As follows, the film layer structure and the preparation method of the light-emitting base plate in the embodiments of present disclosure are further explained and illustrated in conjunction with the accompanying drawings.

Figure 5:
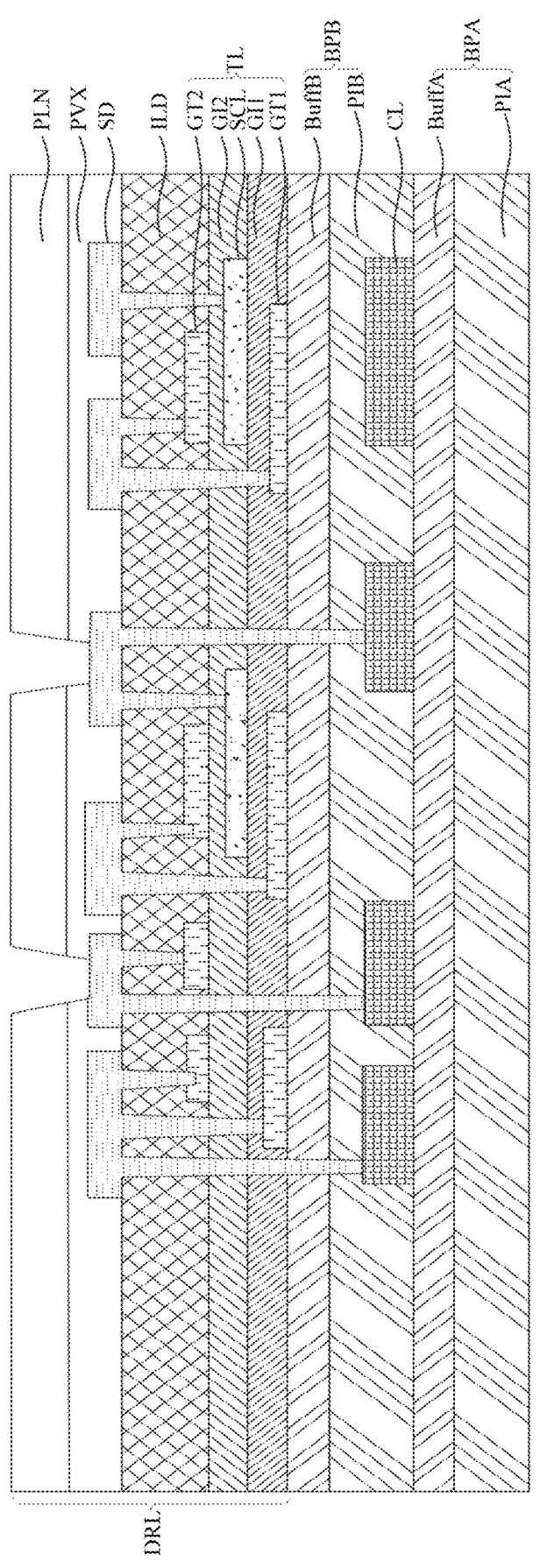
FIG. 5 is a schematic diagram of a structure of a driving backplane in an embodiment of the present disclosure.

In an embodiment of the present disclosure, referring to FIG. 5, the first substrate BPA may include a first polyimide layer PIA and a first inorganic barrier layer BuffA that are stacked in sequence. During preparation, the first polyimide layer PIA and the first inorganic barrier layer BuffA may be sequentially formed on a support substrate BPG. In some embodiments, the first polyimide layer PIA is disposed between the thick copper layer CL and the support substrate BPG, which can balance the stress between the thick copper layer CL and the support substrate BPG, and prevent the thick copper layer CL from causing the support substrate BPG to cock during the preparation process. The first inorganic barrier layer BuffA may achieve isolation between the thick copper layer CL and the first polyimide layer PIA, which can, on the one hand, improve the adhesion force between the thick copper layer CL and the first polyimide layer PIA, and reduce the risk of film layer peeling off of the driving backplane DBP, and on the other hand, also achieve the protection of the thick copper layer CL, and avoid corrosion of the thick copper layer CL by ions or water oxygen that may separate out from the first polyimide layer PIA.

It can be understood that after the preparation of the driving backplane DBP or the light-emitting base plate is completed, the support substrate BPG may be peeled off, and the resulting light-emitting base plate is a flexible light-emitting base plate. Of course, the support substrate BPG may also be retained, and the light-emitting base plate is a rigid light-emitting base plate.

Optionally, the material of the support substrate BPG may be a rigid material to provide support for the preparation of subsequent film layers. In an example, the material of the support substrate BPG may be glass.

Optionally, the thickness of the first polyimide layer PIA may be in a range of 1~30 micrometers, for example, it may be 5 micrometers, 10 micrometers, 15 micrometers, or 20 micrometers.

Optionally, the first inorganic barrier layer BuffA may be an inorganic insulating material layer, for example, it may be a silicon oxide layer, a silicon nitride layer or a silicon nitride oxide layer. The first inorganic barrier layer BuffA may also be a composite film layer including a plurality of inorganic material layers that are arranged in a stacking manner, where the material of the film layer adjacent to the thick copper layer CL is an insulating material. For example, the first inorganic barrier layer BuffA may include a first silicon nitride layer, an amorphous silicon layer and a second silicon nitride layer disposed in sequence on a surface of the first polyimide layer PIA.

In an example, the thickness of the first silicon nitride layer may be in a range of 1000~10000 angstroms, for example, it may be 2000 angstroms, 3000 angstroms, 4000 angstroms, 5000 angstroms, 6000 angstroms, 7000 angstroms, 8000 angstroms, or 9000 angstroms.

In an example, the thickness of the amorphous silicon layer may be in a range of 1~100 angstroms, for example, it may be 3 angstroms, 10 angstroms, 20 angstroms, 30 angstroms, 40 angstroms, 50 angstroms.

In an example, the thickness of the second silicon nitride layer may be in a range of 10~10000 angstroms, for example, it may be 100 angstroms, 500 angstroms, 1000 angstroms, 2000 angstroms, 3000 angstroms, 4000 angstroms, 5000 angstroms, 6000 angstroms, 7000 angstroms, 8000 angstroms, or 9000 angstroms.

Figure 6:
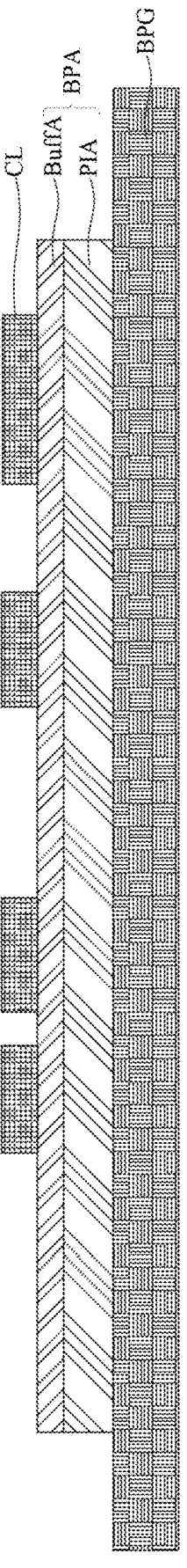
FIG. 6 is a schematic diagram of a structure in which a first substrate and a thick copper layer are sequentially formed on a support substrate in an embodiment of the present disclosure.

Referring to FIG. 6, after the formation of the first substrate BPA, the thick copper layer CL may be formed on a surface of the first substrate BPA. The thickness of the thick copper layer CL may be not less than 0.2 micrometers, especially not less than 2 micrometers. In some embodiments, the thickness of the thick copper layer CL is in a range of 0.2~20 micrometers, for example, it may be 2 micrometers, 3 micrometers, 4 micrometers, 5 micrometers, 10 micrometers, 15 micrometers, 20 micrometers. It can be understood that the greater the thickness of the thick copper layer CL, the lower the impedance of the driving wire on the thick copper layer CL, and the better the uniformity of the driving signal loaded by the driving wire.

Optionally, the thick copper layer CL may be prepared by using an evaporation plating process, a sputtering process, an electroplating process, a chemical plating process, or other feasible processes, or a combination of processes may be used to prepare the thick copper layer CL.

By way of example, in the example of FIG. 6, a whole-surface copper seed layer may be formed through sputtering on a side of the first substrate BPA away from the support substrate BPG, and then a whole-surface copper growth layer may be formed through an electroplating process on the surface of the copper seed layer. In this manner, a whole-surface thick copper material layer is obtained. Then, the thick copper material layer is patterned (e.g., etched) to form the patterned thick copper layer CL. In this example, the sputtering process+the electroplating process are used to prepare the thick copper layer CL. Optionally, the copper seed layer may include a first functional layer, a copper layer and a second functional layer that are stacked in sequence. The first functional layer and the second functional layer may be material layers configured to protect the copper layer or improve the adhesion force, and in particular may be alloy layers. For example, the first functional layer is an alloy layer that is capable of improving the adhesion force between the copper layer and the first inorganic barrier layer BuffA, and the second functional layer is an alloy layer that is capable of avoiding oxidization of the copper layer. In an example, both the first functional layer and the second functional layer are molybdenum-nickel-titanium alloy layers. Optionally, the thickness of the copper seed layer may be less than the thickness of the copper growth layer, for example, the thickness of the copper seed layer is in a range of 300~600 nanometers.

It can be understood that in other examples of the present disclosure, other strategies may also be used to prepare the thick copper layer CL. By way of example, in an example, the thick copper material layer may be formed by means of multiple sputtering, and the thick copper material layer may then be patterned to form the thick copper layer CL. By way of further example, in an example, the thick copper layer CL may include a plurality of sub-layers that are arranged in a stacking manner, and the patterns of the sub-layers may be substantially the same; the patterned sub-layers may be prepared sequentially, and then the patterned thick copper layer CL is obtained. When preparing any one of the sub-layers, a material sub-layer may be first formed through sputtering, and then the material sub-layer is patterned. By way of further example, in an example, a patterned copper seed layer may first be formed, then a patterned copper growth layer may be formed on the patterned copper seed layer through an electroplating process or a chemical plating process, and then the patterned thick copper layer CL is obtained. By way of further example, in an example, a whole-surface copper seed layer may be formed first, and then a pattern defining layer may be prepared on the surface of the copper seed layer, where the pattern defining layer has a pattern defining hole that exposes the copper seed layer, and the pattern of the pattern defining hole is the same as the pattern of the thick copper layer CL to be formed. The patterned copper growth layer may be grown in the pattern defining hole through electroplating or chemical plating; and after the pattern defining layer is removed, the patterned copper growth layer may be used as a mask to pattern the whole-surface copper seed layer, and the remaining copper seed layer and the copper growth layer may form the patterned thick copper layer CL.

Figure 7:
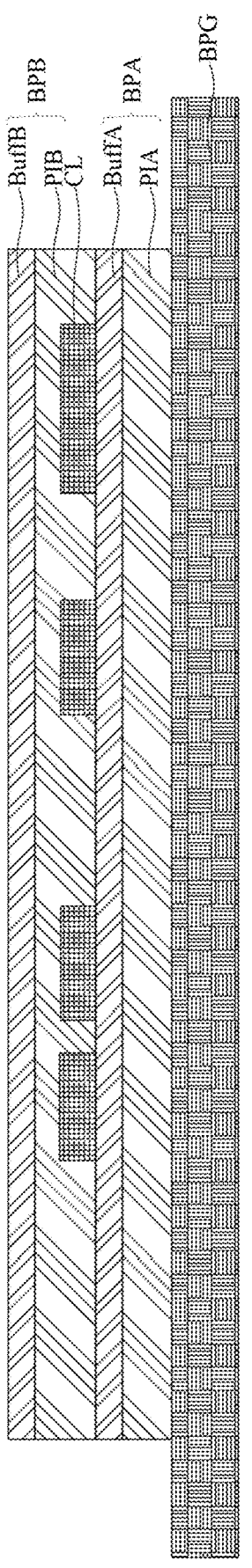
FIG. 7 is a schematic diagram of a structure in which a second substrate covering a thick copper layer is formed in an embodiment of the present disclosure.

Referring to FIG. 7, after the formation of the thick copper layer CL on the surface of the first substrate BPA, the second substrate BPB covering the thick copper layer CL may be further formed.

In an embodiment of the present disclosure, the second substrate BPB may include a second polyimide layer PIB and a second inorganic barrier layer BuffB that are stacked in sequence on a side of the thick copper layer CL away from the first substrate BPA. During preparation, the second polyimide layer PIB may be first coated to cover the thick copper layer CL, and then the second inorganic barrier layer BuffB may be formed on a surface of the second polyimide layer PIB. In this embodiment, the second polyimide layer PIB can achieve a better leveling effect, thereby providing a flat surface for the subsequent film layers, and avoiding the large thickness and high segment difference of the thick copper layer CL from affecting the preparation of the subsequent film layers.

Optionally, the thickness of the second polyimide layer PIB is greater than the thickness of the thick copper layer CL, ensuring that the second polyimide layer PIB is capable of covering the thick copper layer CL and providing a flat surface for the subsequent film layers. For example, the thickness of the second polyimide layer PIB may be 3 to 10 micrometers greater than the thickness of the thick copper layer CL, for example, the thickness of the second polyimide layer PIB may be 3 microns, 5 microns, 7 microns, or 9 microns greater than the thickness of the thick copper layer CL. Moreover, the second polyimide layer PIB directly covers the thick copper layer CL, which allows the second polyimide layer PIB and the thick copper layer CL to be embedded with each other and to have a large adhesion area. This can reduce the risk of film layer separation between the second polyimide layer PIB and the thick copper layer CL.

The second inorganic barrier layer BuffB may include an inorganic insulating material layer, or may include a plurality of inorganic insulating material layers that are arranged in a stacking manner. For example, the second inorganic barrier layer BuffB includes one or a combination of a silicon nitride layer, a silicon oxide layer, a silicon nitride oxide layer, and the like. In an example, the second inorganic barrier layer BuffB may be a silicon nitride layer. In another example, the second inorganic barrier layer BuffB may include a silicon nitride layer and a silicon oxide layer that are arranged in a stacking manner, where the silicon oxide layer is disposed on a side of the silicon nitride layer away from the first substrate BPA. The second inorganic barrier layer BuffB can effectively block the second polyimide layer PIB and the driving layer DRL, avoiding a change in the material property of the driving layer DRL caused by separating out of ions and the like from the second polyimide layer PIB to the driving layer DRL.

Optionally, the thickness of the second inorganic barrier layer BuffB may be in range of 100~10000 angstroms, for example, it may be 1000 angstroms, 2000 angstroms, 3000 angstroms, 4000 angstroms.

Referring to FIG. 1, in an embodiment of the present disclosure, the driving layer DRL is provided with driving circuits PDC configured to drive the light-emitting element LE. In the driving layer DRL, any one of the driving circuits PDC may include a transistor TFT and a storage capacitor. Furthermore, the transistor TFT may be a thin film transistor. The thin film transistor may be selected from top-gate type thin film transistors, bottom-gate type thin film transistors, or double-gate thin film transistors. The material of the active layer of the thin film transistor may be an amorphous silicon semiconductor material, low-temperature polycrystalline silicon semiconductor material, metal oxide semiconductor material, organic semiconductor material, carbon nanotube semiconductor material, or other types of semiconductor materials. The thin film transistor may be an N-type thin film transistor, or a P-type thin film transistor.

It can be understood that in the transistors of the driving circuit PDC, any two of the transistors may be of the same type or different types. Exemplarily, in an embodiment, in a driving circuit PDC, a portion of transistors may be an N-type transistor and a portion of transistors may be a P-type transistor. Exemplarily, in another embodiment of the present disclosure, in a driving circuit PDC, the material of the active layer of a portion of transistors may be a low-temperature polycrystalline silicon semiconductor material, and the material of the active layer of a portion of transistors may be a metal oxide semiconductor material. Exemplarily, in an embodiment of the present disclosure, in a driving circuit PDC, the material of the active layer of each transistor is a low-temperature polycrystalline silicon semiconductor material.

Optionally, the driving layer DRL may include a transistor layer TL, an interlayer dielectric layer ILD and a source-drain metal layer SD that are arranged in a stacking manner, where the interlayer dielectric layer ILD and the source-drain metal layer SD are disposed on a side of the transistor layer TL away from the first substrate BPA. In some embodiments, the transistor layer TL may include a semiconductor layer SCL, a gate insulating layer GI and a gate layer GT that are arranged in a stacking manner. The position relationship among the semiconductor layer SCL, the gate insulating layer GI and the gate layer GT, and the number of layers of each film layer may be determined according to the film layer structure of the thin film transistor.

Optionally, the semiconductor layer SCL may be configured to form the active layer of the transistor, and the active layer may include a channel region of the transistor; and the gate layer may be configured to form a gate layer wire such as a scanning wire, a reset control wire, and a light-emitting control wire, may be configured to form a gate of the transistor, or may be configured to form a portion or all of the electrode plates of the storage capacitor. The gate insulating layer GI is configured to isolate the semiconductor layer SCL and the gate layer GT.

In an embodiment of the present disclosure, the gate layer GT may be one layer, or may be provided as multiple layers as needed. The semiconductor layer SCL may be one layer, or may be provided as multiple layers as needed. It can be understood that when at least one of the gate layer GT and the semiconductor layer SCL is multi-layered, the gate insulating layer GI configured to isolate the gate layer GT and the semiconductor layer SCL also needs to be adaptively provided to be multi-layered.

For example, in an example, the transistor layer TL may include a gate layer GT, a gate insulating layer GI and a semiconductor layer SCL that are stacked in sequence on a side of the second substrate BPB away from the first substrate BPA, and the thin film transistor formed in this transistor layer TL is a bottom-gate type thin film transistor.

By way of further example, in an example, the transistor layer TL may include a semiconductor layer SCL, a gate insulating layer GI and a gate layer GT that are stacked in sequence on the side of the second substrate BPB away from the first substrate BPA, and the thin film transistor formed in this transistor layer TL is a top-gate type thin film transistor.

By way of further example, in an example, the transistor layer TL may include a first gate layer GT1, a first gate insulating layer GI1, a semiconductor layer SCL, a second gate insulating layer GI2, and a second gate layer GT2 that are stacked in sequence on the side of the second substrate BPB away from the first substrate BPA, and at least a portion of the thin film transistors formed in this transistor layer TL may be a double-gate type thin film transistor. In this example, the double-gate type thin film transistor is provided with gates above and below the channel region. On the one hand, the double gates located upper and lower can shade the channel region of the transistor TFT, improving the stability of the semiconductor property of the channel region; and on the other hand, the double gates located upper and lower can reduce the floating body effect of the channel region. In this manner, the double-gate type thin film transistor can improve the stability of the output current, which facilitates the control of the luminescence brightness of the light-emitting element LE.

In this example, a portion of the thin film transistors may be a double-gate type thin film transistor, or all of the thin film transistors may be double-gate type thin film transistors. Further, the driving transistor configured to generate the driving current in the driving circuit PDC is a double-gate type thin film transistor; and the remaining thin film transistors may be top-gate type thin film transistors, bottom-gate type thin film transistors, or double-gate type thin film transistors.

In this example, optionally, the top gate and the bottom gate of the double-gate type thin film transistor may be electrically connected to each other through the source-drain metal layer SD, enabling the electrical properties of the top gate and the bottom gate to be kept homogeneous. For example, the source-drain metal layer SD is provided with a bridging structure, a first portion of the bridging structure is electrically connected to the bottom gate in the first gate layer GT1 through a via, and a second portion of the bridging structure is electrically connected to the top gate in the second gate layer GT2 through a via. As another example, the bottom gate in the first gate layer GT1 may be electrically connected to a first gate wire in the first gate layer GT1, and the top gate in the second gate layer GT2 may be electrically connected to a second gate wire in the second gate layer GT2; and the source-drain metal layer SD is provided with a bridging structure, a first portion of the bridging structure is electrically connected to the first gate wire through a via, and a second portion of the bridging structure is electrically connected to the second gate wire through a via.

In an embodiment of the present disclosure, the gate layer GT may be a molybdenum layer; of course, the gate layer GT may also be other metal layers or alloy layers, or may be a composite film layer of multiple metal layers or alloy layers. Optionally, the thickness of the gate layer GT may be in a range of 100~10000 angstroms, for example, it may be 1000 angstroms, 2000 angstroms, 3000 angstroms, 4000 angstroms, 5000 angstroms, 6000 angstroms.

It can be understood that when the transistor layer TL is provided with two gate layers GT, the materials, thicknesses, etc. of the two gate layers GT may be the same or different.

In an embodiment of the present disclosure, the gate insulating layer GI may be an insulating material layer, or a composite film layer including a plurality of insulating material layers. For example, the gate insulating layer GI may be one or a combination of multiple layers of a silicon nitride layer, a silicon nitride oxide layer, a silicon oxide layer, and the like. The thickness and material of the gate insulating layer GI may be adjusted to adjust the threshold voltage of the thin film transistor. It can be understood that when the transistor layer TL is provided with a plurality of gate insulating layers GI, the materials, thicknesses, etc. of any two of the gate insulating layers GI may be the same or different.

As follows, the preparation method of the transistor layer TL is exemplarily described in an example in which the transistor layer TL includes a first gate layer GT1, a first gate insulating layer GI1, a semiconductor layer SCL, a second gate insulating layer GI2, and a second gate layer GT2 that are stacked in sequence.

Figure 8:
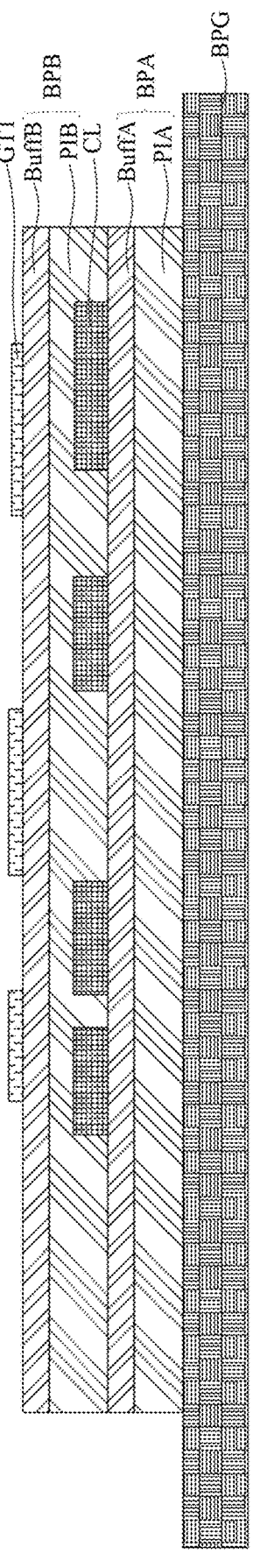
FIG. 8 is a schematic diagram of a structure in which a first gate layer is formed on a second substrate in an embodiment of the present disclosure.

Referring to FIG. 8, after the formation of the second substrate BPB, the first gate layer GT1 may be first formed on the side of the second substrate BPB away from the first substrate BPA. Specifically, a whole-surface first gate material layer may be formed first, and then the first gate material layer is patterned to form the patterned first gate layer GT1.

In this example, the material of the first gate layer GT1 may be molybdenum, and the thickness of the first gate layer GT1 may be in a range of 100~10000 angstroms.

Figure 9:
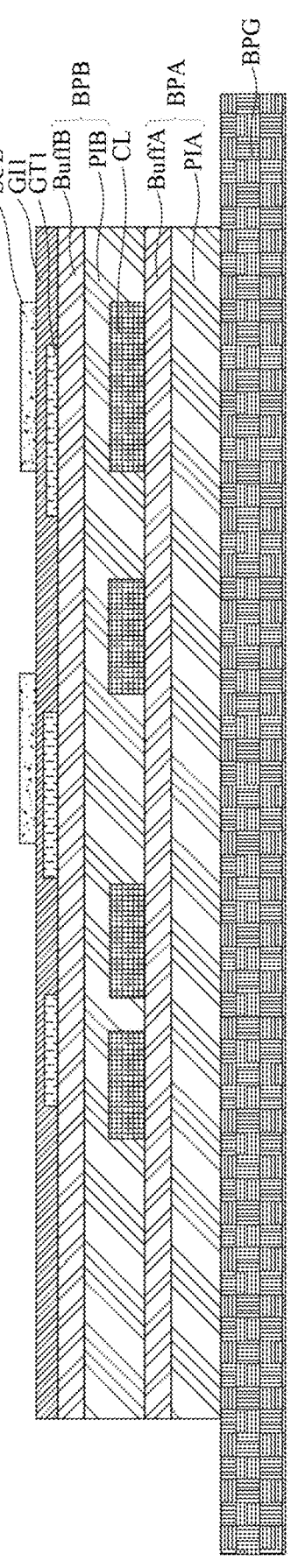
FIG. 9 is a schematic diagram of a structure in which a first gate insulating layer and a semiconductor layer are formed in an embodiment of the present disclosure.

Referring to FIG. 9, after the formation of the first gate layer GT1, the first gate insulating layer GI1 may be further formed, and then the semiconductor layer SCL may be formed on a surface of the first gate insulating layer GI1.

In this example, the currently formed first gate insulating layer GI1 may be a whole-surface film layer, which does not need to be patterned; when the interlayer dielectric layer ILD is patterned, the first gate insulating layer GI1 may be patterned together to reduce the patterning process and reduce the preparation cost of the driving backplane DBP. It can be understood that, if necessary, the first gate insulating layer GI1 may be patterned before the formation of the semiconductor layer SCL.

In this example, the first gate insulating layer GI1 may be a silicon oxide layer, or a composite film layer of a silicon oxide layer and a silicon nitride layer. Further, the thickness of the first gate insulating layer GI1 may be in a range of 100~5000 angstroms.

In an example, in the first gate insulating layer GI1, the thickness of the silicon nitride layer is in a range of 100~300 angstroms, and the thickness of the silicon oxide layer is in a range of 2000~5000 angstroms; and the silicon oxide layer is disposed on a side of the silicon nitride layer away from the first substrate BPA.

In this example, the material of the semiconductor layer SCL may be low-temperature polycrystalline silicon. In preparing the semiconductor layer SCL, an amorphous silicon layer may be first deposited on the surface of the first gate insulating layer GI1, followed by dehydrogenation, acid washing (e.g., surface cleaning by using hydrofluoric acid), crystallization, and patterning operations. Finally, the channel region of the transistor is doped to adjust the threshold voltage of the thin film transistor. Optionally, thermal annealing or laser annealing may be used to achieve the crystallization of the amorphous silicon.

In an example, the thickness of the semiconductor layer SCL may be in a range of 100~10000 angstroms, and in particular may be in a range of 100~800 angstroms.

Figure 10:
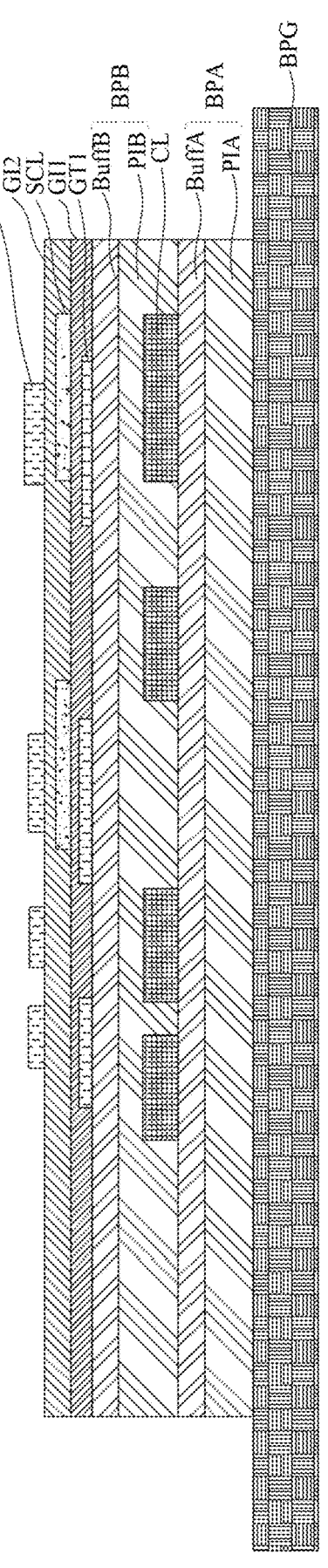
FIG. 10 is a schematic diagram of a structure in which a second gate insulating layer and a second gate layer are formed in an embodiment of the present disclosure.

Referring to FIG. 10, after the formation of the semiconductor layer SCL, the second gate insulating layer GI2 and the second gate layer GT2 may be sequentially formed on a side of the semiconductor layer SCL away from the first substrate BPA.

In this example, the material of the second gate insulating layer GI2 may be silicon nitride, and the thickness of the second gate insulating layer GI2 may be in a range of 100~10000 angstroms.

In this example, the currently prepared second gate insulating layer GI2 may be a whole-surface film layer, which does not need to be patterned; when the interlayer dielectric layer ILD is patterned, the second gate insulating layer GI2 may be patterned together to reduce the patterning process and reduce the preparation cost of the driving backplane DBP. It can be understood that, if necessary, the second gate insulating layer GI2 may be patterned before the formation of the second gate layer GT2.

In this example, in forming the second gate layer GT2, a whole-surface second gate material layer may be formed first, and then the second gate material layer is patterned to form the patterned second gate layer GT2.

In this example, the material of the second gate layer GT2 may be molybdenum, and the thickness of the second gate layer GT2 may be in a range of 100~10000 angstroms.

Figure 11:
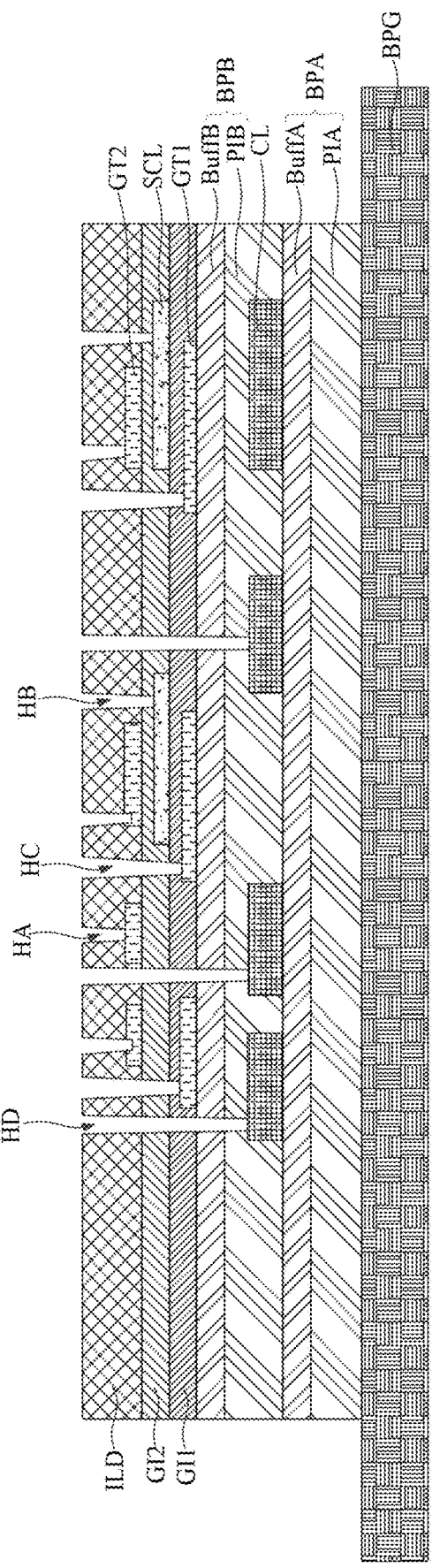
FIG. 11 is a schematic diagram of a structure in which an interlayer dielectric layer is formed in an embodiment of the present disclosure.
Figure 12:
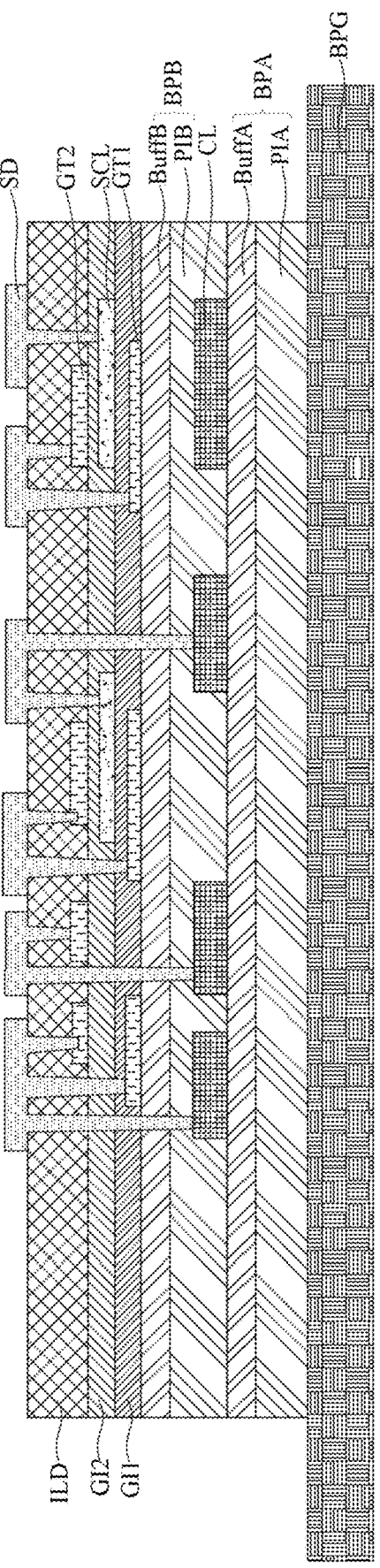
FIG. 12 is a schematic diagram of a structure in which a source-drain metal layer is formed in an embodiment of the present disclosure.

In an embodiment of the present disclosure, referring to FIGS. 11 and 12, after the formation of the transistor layer TL, the interlayer dielectric layer ILD and the source-drain metal layer SD may be sequentially prepared on a side of the transistor layer TL away from the first substrate BPA, achieving interconnection between thin film transistors.

Referring to FIG. 11, in preparing the interlayer dielectric layer ILD, an interlayer dielectric material layer may be formed first, and then a patterning operation may be performed to form a via and cause the interlayer dielectric material layer to be patterned as the interlayer dielectric layer ILD. Referring to FIG. 12, the source-drain metal layer SD is electrically connected to the thick copper layer CL and the transistor layer TL through the formed via. During the patterning operation of the interlayer dielectric material layer, a plurality of types of vias may be formed as needed to meet the requirement that the source-drain metal layer SD is electrically connected to different film layers through different vias. For example, in the example of FIG. 11, four different types of vias may be formed, i.e., a first via HA, a second via HB, a third via HC, and a fourth via HD. In some embodiments, the first via HA passes through the interlayer dielectric layer ILD to expose the second gate layer GT2. The second via HB passes through the interlayer dielectric layer ILD and the second gate insulating layer GI2 to expose the semiconductor layer SCL. The third via HC passes through the interlayer dielectric layer ILD, the second gate insulating layer GI2 and the first gate insulating layer GI1 to expose the first gate layer GT1. The fourth via HD passes through the interlayer dielectric layer ILD, the second gate insulating layer GI2, the first gate insulating layer GI1, and the second substrate BPB to expose the thick copper layer CL. In this way, when the source-drain metal layer SD is formed, the source-drain metal layer SD may be electrically connected to the second gate layer GT2 through the first via HA, the source-drain metal layer SD may be electrically connected to the semiconductor layer SCL through the second via HB, the source-drain metal layer SD may be electrically connected to the first gate layer GT1 through the third via HC, and the source-drain metal layer SD may be electrically connected to the thick copper layer CL through the fourth via HD.

It can be understood that when the film layer structure of the driving backplane DBP is different or the electrical connection relationship is different, the type, number and position of the via formed prior to the formation of the source-drain metal layer SD may be different, whichever is capable of enabling the electrical connection of the thick copper layer CL and the transistor layer TL to the source-drain metal layer SD.

In this embodiment, when the second substrate BPB, the first gate insulating layer GI1 and the second gate insulating layer GI2 are prepared, patterning operations are not required; and before the formation of the source-drain metal layer SD, these film layers may be patterned together with the interlayer dielectric layer ILD to form the desired vias. This can reduce the number of required mask plates, reduce the manufacturing process, and reduce the preparation cost of the driving backplane DBP and the light-emitting base plate.

In this embodiment, the vias may be formed by using a mask plate, or the vias may be formed by using the cooperation of a plurality of mask plates. When two or more different types of vias are formed by using the same mask plate, selective etching of different film layers may be achieved by selecting and controlling the etching conditions, thereby controlling the depth of each via.

For example, in an example, the positions of four types of vias, i.e., the first via HA, the second via HB, the third via HC, and the fourth via HD, may be defined simultaneously by using a mask plate. In etching to form the vias, multiple etching may be used, and each time the etching is done, an etching condition with a high etching selectivity ratio may be selected according to the material to be etched. In this way, four types of vias with different depths are achieved through multiple etching.

By way of further example, in another example, the positions of the vias may be defined by using two mask plates. For example, a first mask plate may be first used to define the position of the fourth via HD, and then the fourth via HD is prepared through etching. Thereafter, a second mask plate may be used to define the position of the first via HA, the position of the second via HB, and the position of the third via HC, and then the first via HA, the second via HB, and the third via HC are prepared through etching.

In an embodiment of the present disclosure, the interlayer dielectric layer ILD may include an inorganic insulating material layer, or may include a plurality of inorganic insulating material layers that are arranged in a stacking manner. In an example, the interlayer dielectric layer ILD includes a silicon oxide layer and a silicon nitride layer that are arranged in a stacking manner, where the silicon nitride layer is disposed on a side of the silicon oxide layer away from the first substrate BPA. In another example, the material of the interlayer dielectric layer ILD is silicon nitride.

Optionally, the thickness of the interlayer dielectric layer ILD may be is a range of 2000~20000 angstroms.

In this embodiment, the source-drain metal layer SD may be prepared through a sputtering process, for example, by first forming a whole-surface source-drain metal material layer, and then performing a patterning operation on the source-drain metal material layer to form the patterned source-drain metal layer SD.

Optionally, the source-drain metal layer SD may include a metal layer, or may include a plurality of metal layers or alloy layers. For example, the source-drain metal layer SD may include a third functional layer, a host metal layer and a fourth functional layer that are stacked in sequence on a surface of the interlayer dielectric layer ILD, and the third functional layer and the fourth functional layer may provide protection for the host metal layer or improve the adhesion force between the host metal layer and other film layers. Optionally, the third functional layer and the fourth functional layer may be made of an alloy material (e.g., a molybdenum-nickel-titanium alloy, a molybdenum-niobium alloy, a copper-nickel alloy, a nickel-tungsten alloy, a nickel-vanadium alloy, etc.), an inert metal material (e.g., titanium or molybdenum), or a conductive metal compound (e.g., a conductive metal oxide or titanium nitride), and so forth; furthermore, the material of the third functional layer and the material of the fourth functional layer may be the same, or may be different. Optionally, the material of the host metal layer may be a material having a high electrical conductivity, for example, it may be aluminum or copper.

In an example, the material of the third functional layer and the material of the fourth functional layer are molybdenum-nickel-titanium alloys. The material of the host metal layer is copper.

Optionally, the thickness of the third functional layer is in a range of 100~1000 angstroms, the thickness of the fourth functional layer is in a range of 100~1000 angstroms, and the thickness of the host metal layer is in a range of 100~100000 angstroms. For example, the thickness of the host metal layer is 3000 angstroms, 4000 angstroms, 5000 angstroms, 6000 angstroms, 7000 angstroms, 8000 angstroms.

Optionally, the driving layer DRL may also be provided with an insulating protective layer disposed on a side of the source-drain metal layer SD away from the first substrate BPA. The insulating protective layer covers the source-drain metal layer SD and has openings for exposing the device pads. The insulating protective layer may be a one-layered structure or a composite film layer with a multi-layered structure.

Figure 13:
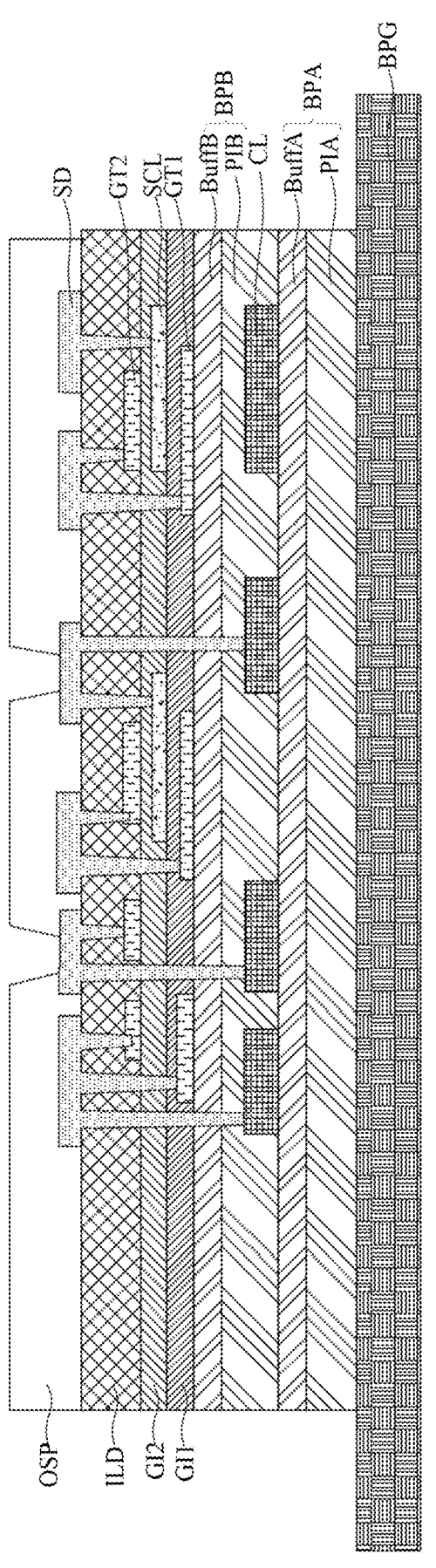
FIG. 13 is a schematic diagram of a structure in which an organic solderability protective layer is formed in an embodiment of the present disclosure.

In an example, referring to FIG. 13, the insulating protective layer is an organic solderability protective layer OSP. optionally, a coating process may be used to form this organic solderability protective layer.

In another example, referring to FIG. 5, the insulating protective layer may include a passivation layer PVX and a planarization layer PLN that are arranged in a stacking manner. In some embodiments, the passivation layer PVX may be an inorganic material, and the planarization layer PLN may be an organic material. Optionally, a passivation material (e.g., silicon nitride) may be deposited first to form a whole-surface passivation layer PVX, and then a planarization material (e.g., resin) may be coated or printed to form a whole-surface planarization layer PLN; and then the planarization layer PLN and the passivation layer PVX may be patterned to form the binding openings exposing the device pads.

Figure 14:
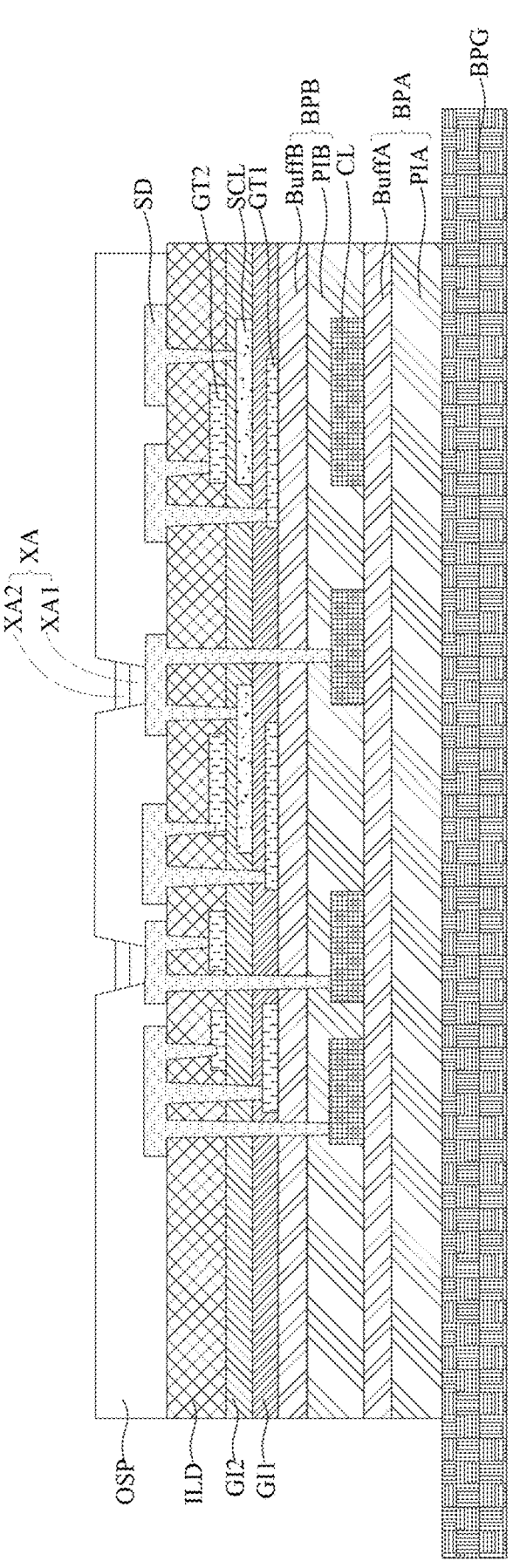
FIG. 14 is a schematic diagram of a structure in which a soldering aid layer is formed in an embodiment of the present disclosure.

In some embodiments of the present disclosure, referring to FIGS. 1 and 14, the driving backplane DBP may further include a soldering aid layer XA disposed on a surface of the device pad, and the light-emitting element LE is electrically connected to the soldering aid layer XA through the conductive connection structure XB, thereby improving the rework performance and the binding stability of the light-emitting element LE. By way of example, after the insulating protective layer is formed, a nickel layer XA1 and a gold layer XA2 may be sequentially grown in the binding opening through a chemical plating process or an electroplating process, where the nickel layer XA1 and the gold layer XA2 serve together as the soldering aid layer XA. In some embodiments, the nickel layer has a greater thickness than the gold layer. It can be understood that in other embodiments of the present disclosure, the soldering aid layer XA may also be made of other structures or materials; or, the driving backplane DBP may not be provided with the soldering aid layer XA, and the light-emitting element LE is directly bound to the device pad through the conductive connection structure XB.

In the example of FIG. 5, the source-drain metal layer SD is electrically connected, in a direct manner, to the thick copper layer CL through a via. It can be understood that in other embodiments of the present disclosure, the source-drain metal layer SD may also be electrically connected to the thick copper layer CL through the adapter coupling of other film layers, i.e., the source-drain metal layer SD is electrically connected, in an indirect manner, to the thick copper layer CL through a via. For example, the driving backplane DBP is provided with an adapter pad between the source-drain metal layer SD and the thick copper layer CL, a first portion of the adapter pad is connected to the thick copper layer CL through a via, and a second portion of the adapter pad is electrically connected to the source-drain metal layer SD through a via. The adapter pad may be provided in the first gate layer GT1 or the second gate layer GT2; the adapter pad may be a multi-layered structure spanning the first gate layer GT1 and the second gate layer GT2, or the adapter pad may be a newly added metal film layer on the driving backplane DBP; or other feasible manners may be taken. In this way, it can avoid an excessive depth of a single via that leads to an excessive size of the via, and thus avoid an excessive size of the via that affects and restricts the resolution and the like of the light-emitting base substrate, and reduce the difficulty of preparing the driving backplane DBP.

Figure 15:
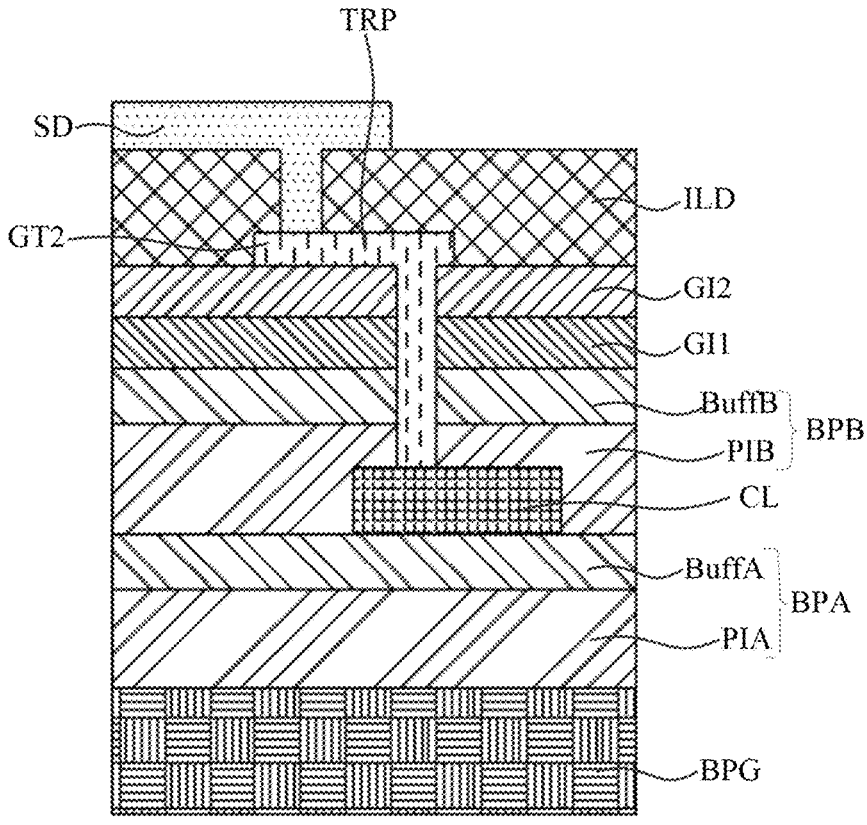
FIG. 15 is a schematic diagram of a structure in which an adapter pad is provided in a second gate layer in an embodiment of the present disclosure.

For example, in an embodiment of the present disclosure, referring to FIG. 15, the second gate layer GT2 is provided with an adapter pad TRP, a first portion of the adapter pad TRP is connected to the thick copper layer CL through a via that passes through the second gate insulating layer GI2, the first gate insulating layer GI1 and the second substrate BPB, and a second portion of the adapter pad TRP is connected to the source-drain metal layer SD through a via that passes through the interlayer dielectric layer ILD.

Figure 16:
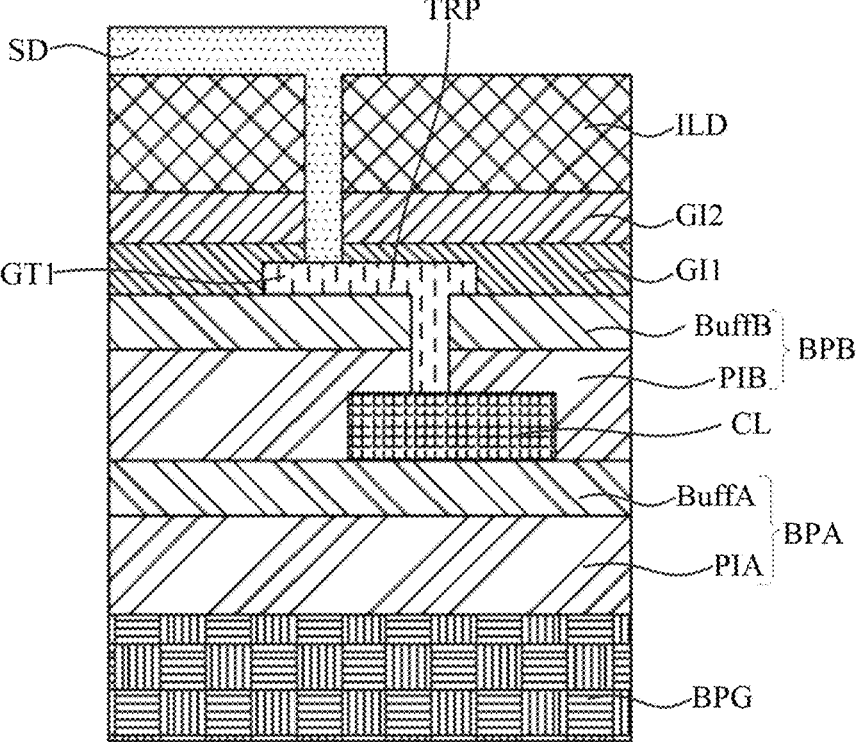
FIG. 16 is a schematic diagram of a structure in which an adapter pad is provided in a first gate layer in an embodiment of the present disclosure.

By way of further example, in an embodiment of the present disclosure, referring to FIG. 16, the first gate layer GT1 is provided with an adapter pad TRP, a first portion of the adapter pad TRP is connected to the thick copper layer CL through a via that passes through the second substrate BPB, and a second portion of the adapter pad TRP is connected to the source-drain metal layer SD through a via that passes through the interlayer dielectric layer ILD, the second gate insulating layer GI2 and the first gate insulating layer GI1.

Figure 17:
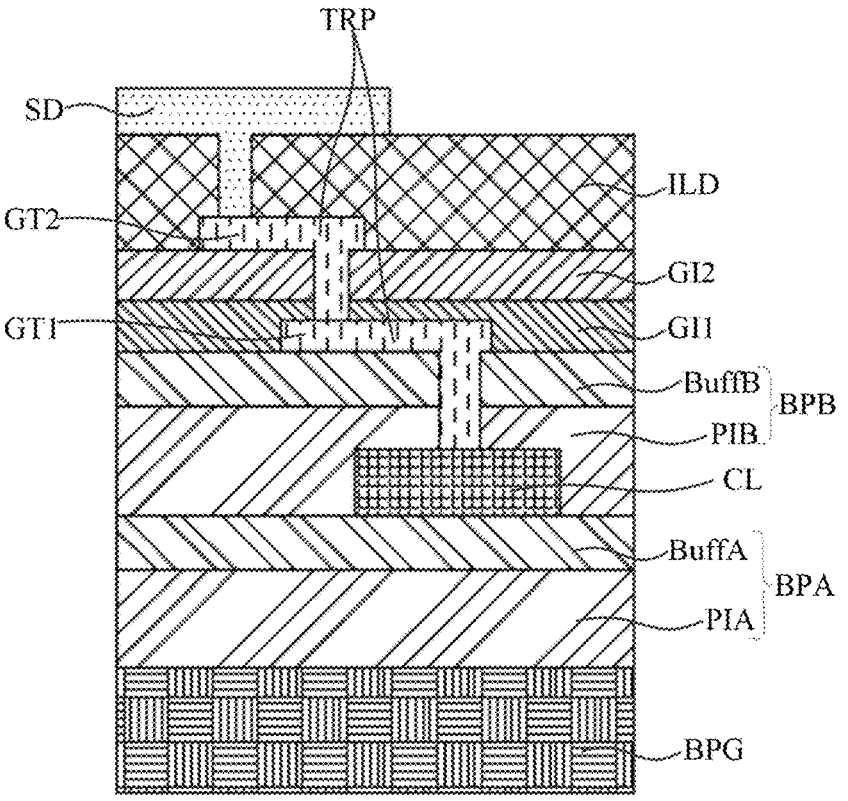
FIG. 17 is a schematic diagram of a structure in which an adapter pad is provided in a first gate layer and a second gate layer in an embodiment of the present disclosure.

By way of further example, in an embodiment of the present disclosure, referring to FIG. 17, the adapter pad TRP includes a first portion of the adapter pad TRP disposed in the first gate layer GT1 and a second portion of the adapter pad TRP disposed in the second gate layer GT2. The first portion of the adapter pad TRP is electrically connected to the thick copper layer CL through a via that passes through the second substrate BPB; the second portion of the adapter pad TRP is electrically connected to the source-drain metal layer SD through a via that passes through the interlayer dielectric layer ILD; and the first portion of the adapter pad TRP and the second portion of the adapter pad TRP are electrically connected to each other through a via that passes through the second gate insulating layer GI2 and the first gate insulating layer GI1.

Figure 18:
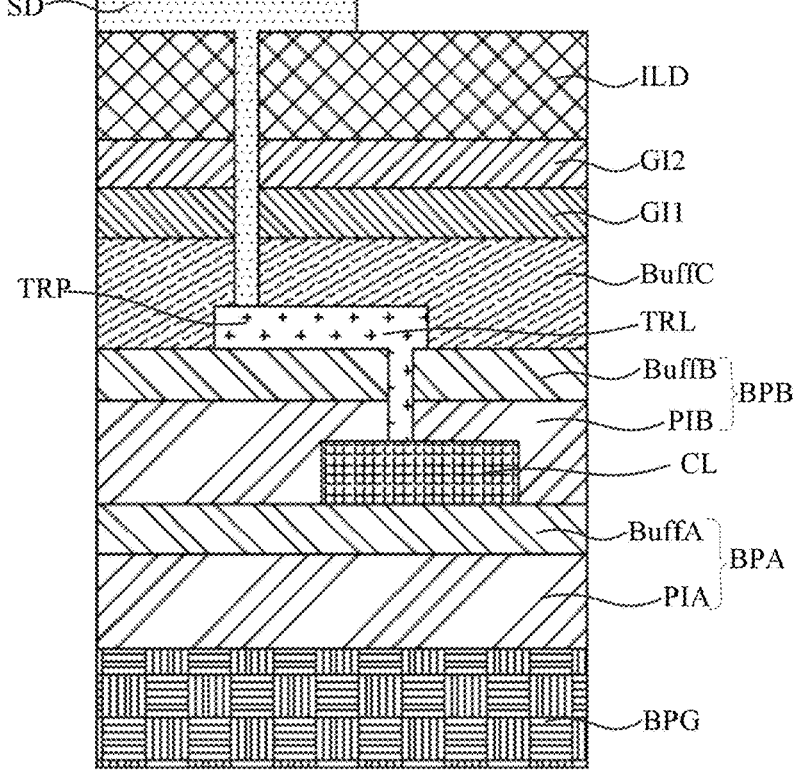
FIG. 18 is a schematic diagram of a structure in which an adapter pad is provided in an adapter layer in an embodiment of the present disclosure.

By way of further example, in an embodiment of the present disclosure, referring to FIG. 18, between the second substrate BPB and the transistor layer TL, the driving backplane DBP is provided with an adapter layer TRL and a third inorganic barrier layer BuffC covering the adapter layer TRL. The transistor layer TL is disposed on a side of the third inorganic barrier layer BuffC away from the first substrate BPA. In some embodiments, the adapter layer TRL is provided with an adapter pad TRP; a first portion of the adapter pad TRP is electrically connected to the thick copper layer CL through a via that passes through the second substrate BPB, and a second portion of the adapter pad TRP is connected to the source-drain metal layer SD through a via that passes through the interlayer dielectric layer ILD, the transistor layer TL and the third inorganic barrier layer BuffC.

In this embodiment, the third inorganic barrier layer BuffC may include an inorganic insulating material layer or may include a plurality of inorganic material layers that are arranged in a stacking manner. For example, the third inorganic barrier layer BuffC may include one or more of the following: a silicon nitride layer, a silicon oxide layer, a silicon oxynitride layer. In an example, the third inorganic barrier layer BuffC is a silicon nitride layer, and the thickness of which may be in a range of 100~10,000 angstroms.

In this embodiment, the adapter layer TRL may include a one-layered structure or a stacked multi-layered structure, and these film layer structures may be metal layers or alloy layers. In an example, the adapter layer TRL may be a molybdenum layer. Optionally, the thickness of the adapter layer TRL may be in a range of 100~10000 angstroms, for example, it may be 1000 angstroms, 2000 angstroms, 3000 angstroms, 4000 angstroms, 5000 angstroms, 6000 angstroms, 7000 angstroms, or 8000 angstroms.

As follows, the structure and the preparation process of the driving backplane DBP are exemplarily described by taking the example that the driving backplane DBP is provided with the adapter layer TRL and the transistor layer TL includes two gate layers.

Figure 19:
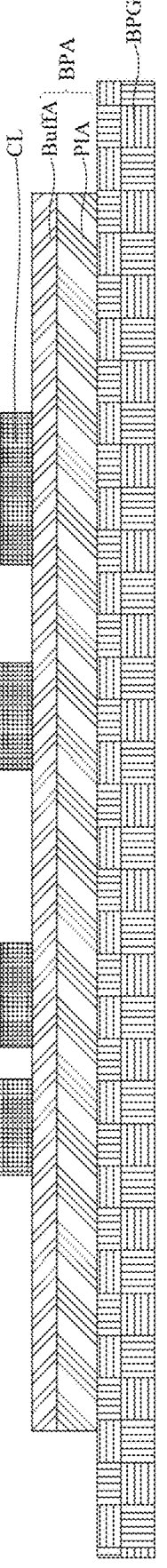
FIG. 19 is a schematic diagram of a structure in which a first substrate and a thick copper layer are sequentially formed on a support substrate in an embodiment of the present disclosure.

Referring to FIG. 19, the first substrate BPA and the thick copper layer CL may be prepared sequentially on the support substrate BPG.

Figure 20:
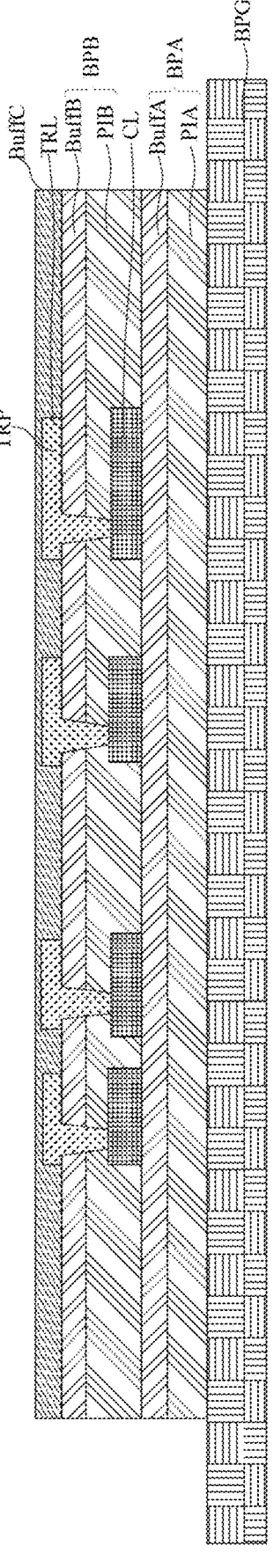
FIG. 20 is a schematic diagram of a structure in which a second substrate, an adapter layer and a third inorganic barrier layer are sequentially formed in an embodiment of the present disclosure.

Referring to FIG. 20, after the preparation of the thick copper layer CL is completed, the second substrate BPB having vias may be continued to be prepared. For example, the whole-surface second polyimide layer PIB covering the thick copper layer CL may be formed through a coating or a printing process; the whole-surface second inorganic barrier layer BuffB may be formed on the surface of the second polyimide layer PIB through a deposition process; and then the whole-surface second inorganic barrier layer BuffB and the second polyimide layer PIB are patterned to form the vias exposing the thick copper layer CL.

After the second substrate BPB having vias is prepared, the whole-surface adapter material layer may be formed through a deposition process (e.g., a sputtering process), and then a patterning operation may be performed on the whole-surface adapter material layer to form the patterned adapter layer TRL having the adapter pad TRP. In some embodiments, the first portion of the adapter pad TRP is electrically connected to the thick copper layer CL through the via on the second substrate BPB.

After the adapter layer TRL is prepared, the third inorganic barrier layer BuffC covering the adapter layer TRL is formed. Referring to FIG. 20, the third inorganic barrier layer BuffC may not be patterned through a patterning operation, but rather be patterned when the interlayer dielectric layer ILD is patterned through a patterning operation. Of course, if necessary, the third inorganic barrier layer BuffC may also be patterned before the transistor layer TL is prepared.

Figure 21:
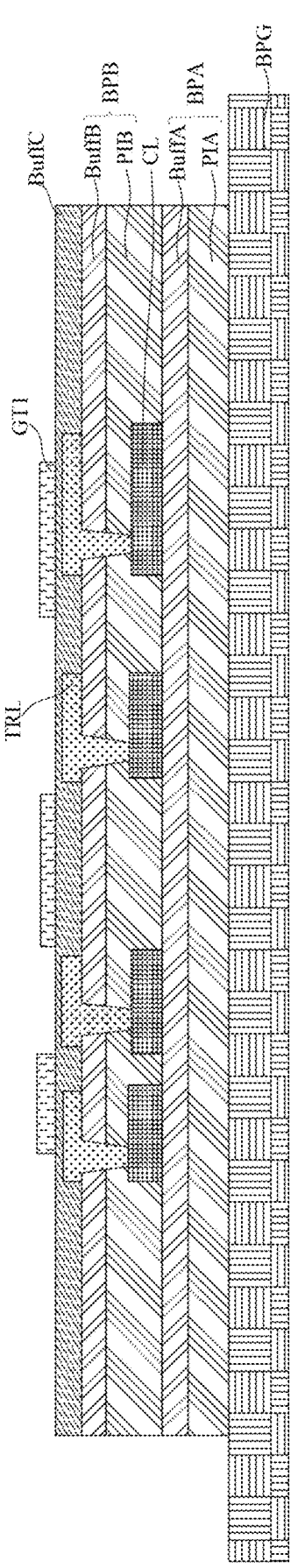
FIG. 21 is a schematic diagram of a structure in which a first gate layer is formed on a third inorganic barrier layer in an embodiment of the present disclosure.

Referring to FIG. 21, after the third inorganic barrier layer BuffC is formed, the patterned first gate layer GT1 may be formed on the surface of the third inorganic barrier layer BuffC.

Figure 22:
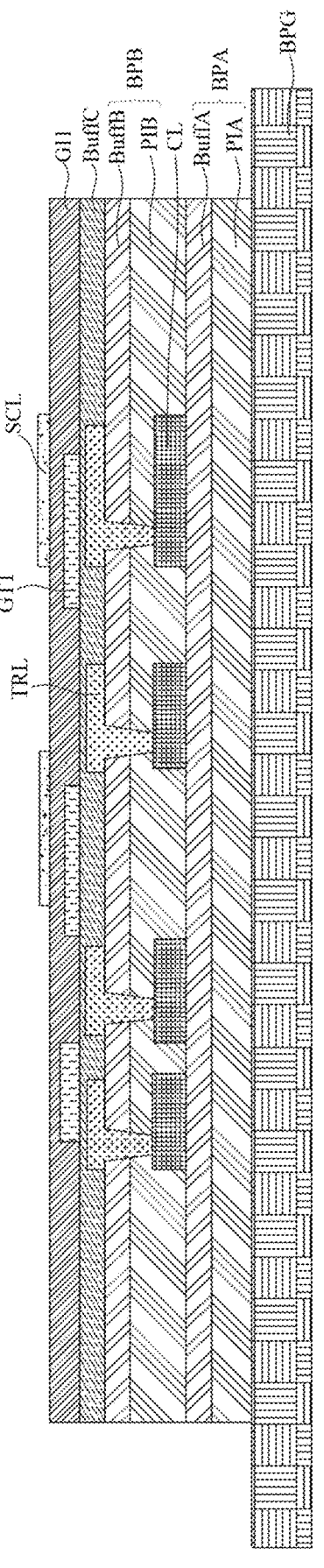
FIG. 22 is a schematic diagram of a structure in which a first gate insulating layer and a semiconductor layer are formed in an embodiment of the present disclosure.

Referring to FIG. 22, after the first gate layer GT1 is formed, the first gate insulating layer GI1 covering the first gate layer GT1 may be continued to be formed, and then the patterned semiconductor layer SCL may be formed on the surface of the first gate insulating layer GI1.

Figure 23:
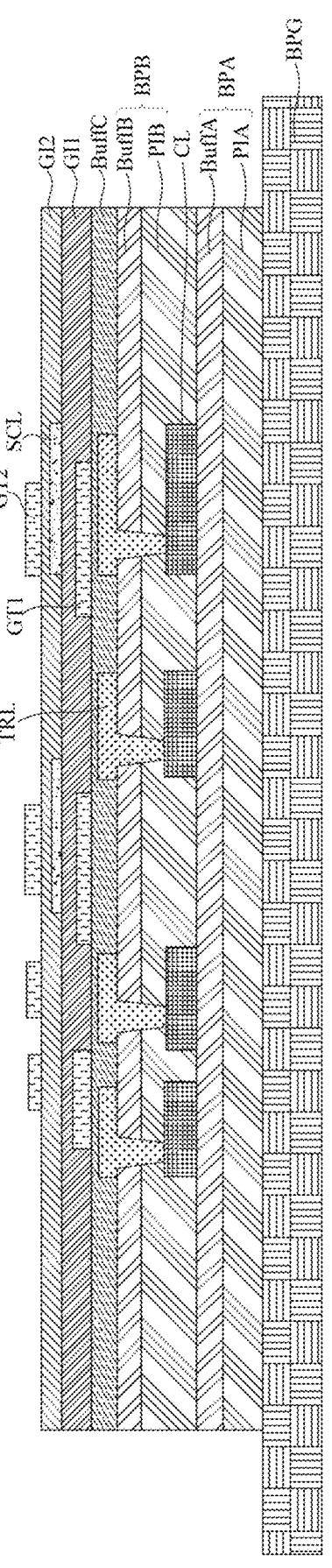
FIG. 23 is a schematic diagram of a structure in which a second gate insulating layer and a second gate layer are formed in an embodiment of the present disclosure.

Referring to FIG. 23, after the semiconductor layer SCL is formed, the second gate insulating layer GI2 covering the semiconductor layer SCL may be continued to be formed; and then the patterned second gate layer GT2 is formed on the surface of the second gate insulating layer GI2.

Figure 24:
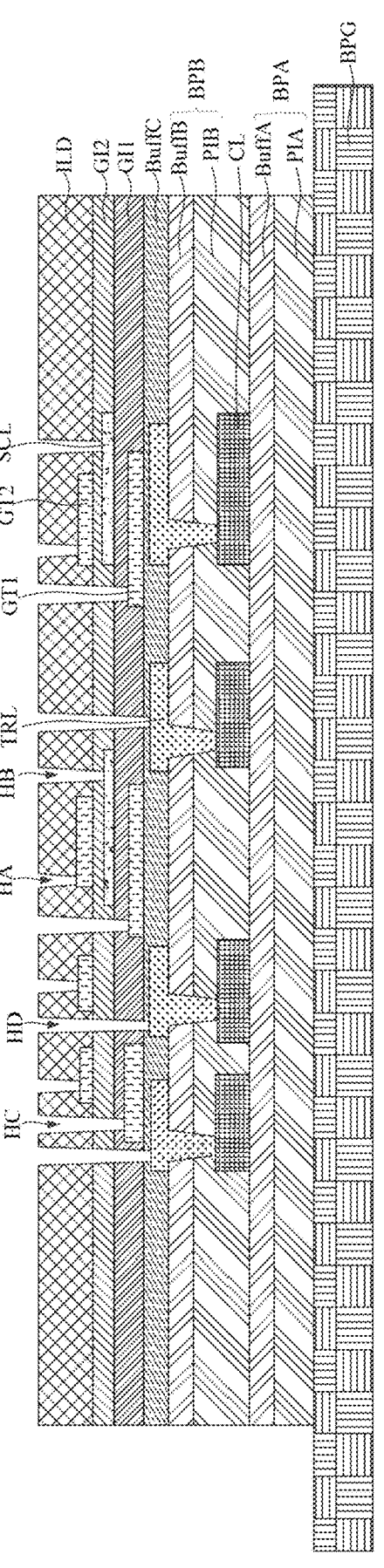
FIG. 24 is a schematic diagram of a structure in which an interlayer dielectric layer is formed in an embodiment of the present disclosure.

Referring to FIG. 24, after the patterned second gate layer GT2 is formed, the whole-surface interlayer dielectric material layer covering the second gate layer GT2 is formed. Then, a patterning operation is performed to form the desired vias, e.g., forming the first via HA that exposes the second gate layer GT2, the second via HB that exposes the semiconductor layer SCL, the third via HC that exposes the first gate layer GT1, and the fourth via HD that exposes the second portion of the adapter pad TRP. In this example, the fourth via HD does not need to pass through the second substrate BPB, and thus its via depth is reduced and the preparation is less difficult. In the process, the interlayer dielectric material is patterned as the interlayer dielectric layer ILD; and the third inorganic barrier layer BuffC, the first gate insulating layer GI1, the second gate insulating layer GI2, and the like are also patterned.

In this embodiment, a mask plate may be used to define the vias, or a plurality of mask plates may be used to define the vias. By way of example, in an example, the same mask plate may be used to define the vias; and four different vias are prepared by selecting suitable etching conditions, e.g., by selecting an etchant having a high selectivity ratio. By way of further example, in another example, two mask plates may be used to define the vias. In this example, a first mask plate may be used to define the position of the fourth via HD, and the fourth via HD is prepared through etching; and then a second mask plate may be used to define the position of the first via HA, the position of the second via HB, and the position of the third via HC, and the first via HA, the second via HB and the third via HC are prepared through etching.

Figure 25:
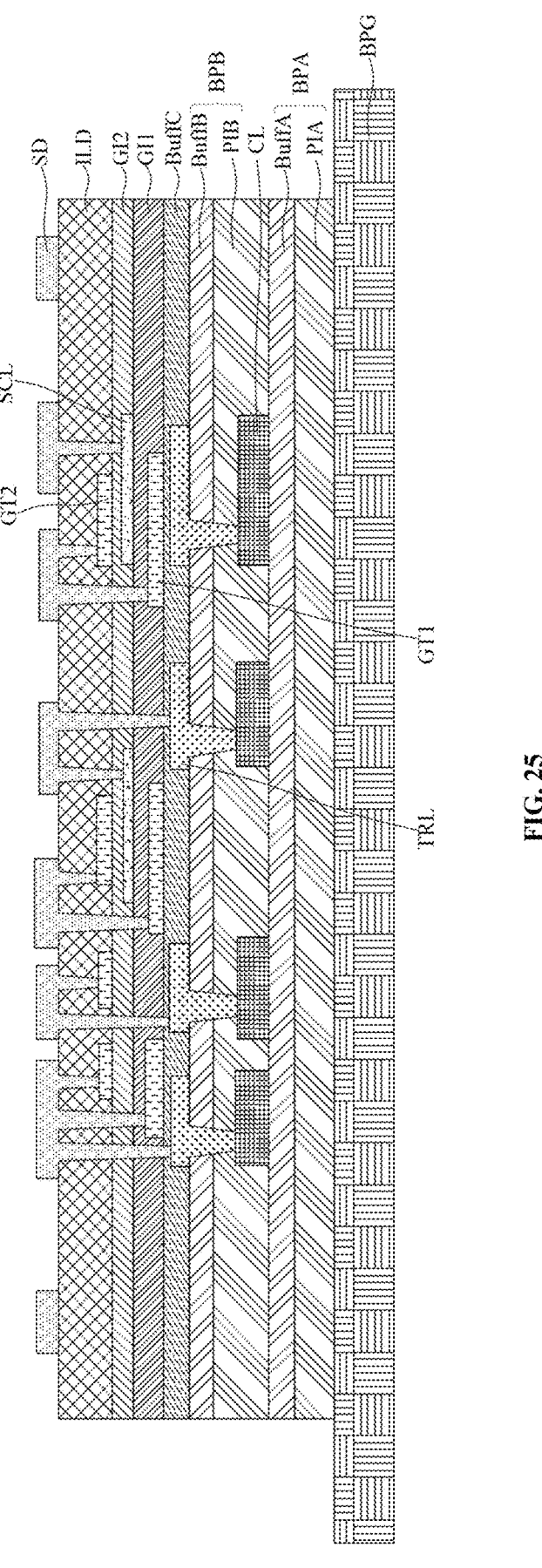
FIG. 25 is a schematic diagram of a structure in which a source-drain metal layer is formed in an embodiment of the present disclosure.

Referring to FIG. 25, after the desired vias are formed, the patterned source-drain metal layer SD is formed on the side of the interlayer dielectric layer ILD away from the first substrate BPA. In this way, the source-drain metal layer SD is electrically connected to the thick copper layer CL through the adapter pad TRP disposed in the adapter layer TRL.

Figure 26:
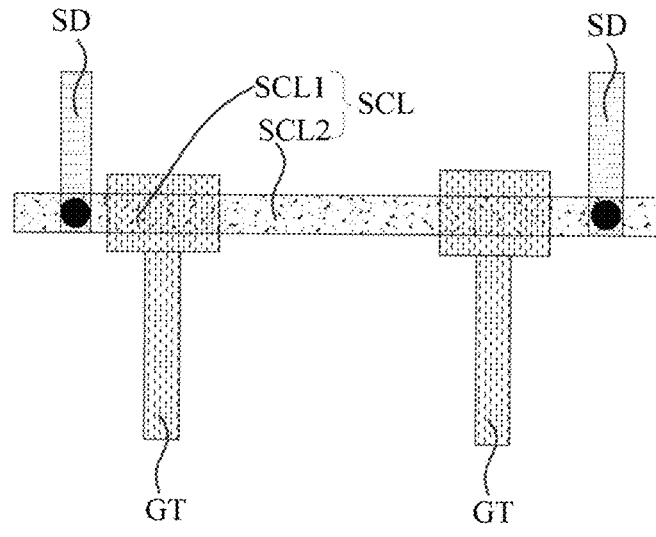
FIG. 26 is a schematic partial diagram of a coordination among a semiconductor layer, a gate layer and a source-drain metal layer in an embodiment of the present disclosure.
Figure 27:
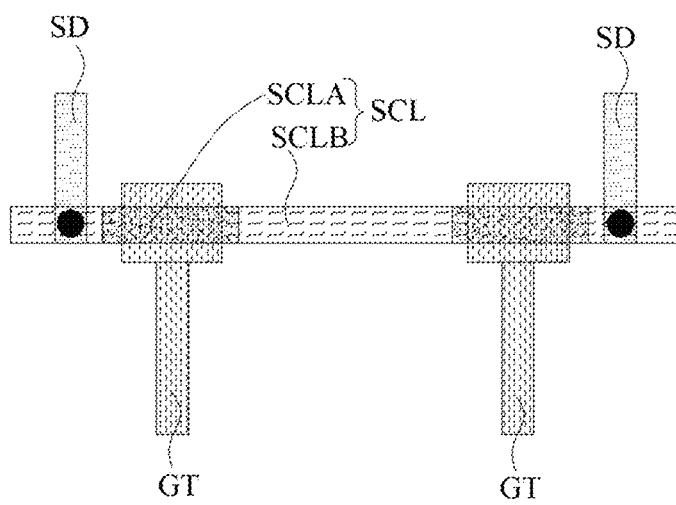
FIG. 27 is a schematic partial diagram of a coordination among a semiconductor layer, a gate layer and a source-drain metal layer in an embodiment of the present disclosure.
Figures 1, 28:
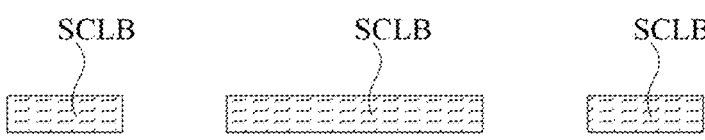
Figures 2, 28:
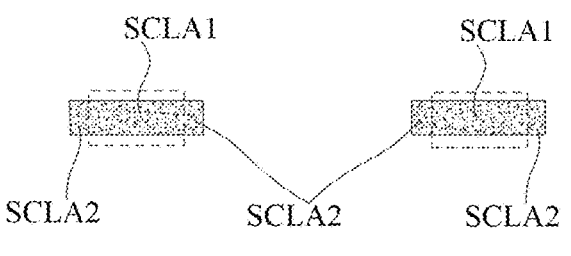
Figures 3, 28:
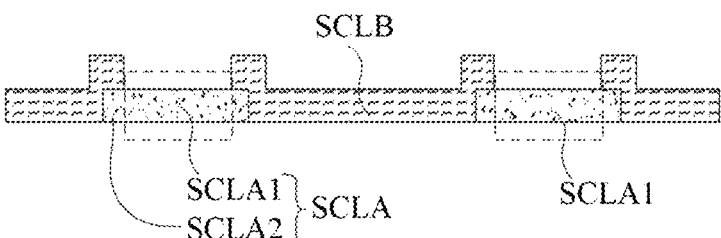

In the above-described embodiment, the structures of the semiconductor layer SCL have the same host material; when there is a difference in the electrical conductivity between the different structures of the semiconductor layer SCL, the difference arises from a difference in the dopant material doped in the host material, for example, a difference in the dopant concentration or a difference in the type of dopant. For example, referring to FIG. 26, the semiconductor layer SCL may include a channel structure SCL1 that maintains the semiconductor property, and a semiconductor conductive structure SCL2 that is made to be conductive; the host material of the channel structure SCL1 and the host material of the semiconductor conductive structure SCL2 are both semiconductor materials, e.g., both are polycrystalline silicon. The channel structure SCL1 and the semiconductor conductive structure SCL2 differ only in the type or concentration of the doped ions. In some embodiments, in the semiconductor conductive structure SCL2, the semiconductor material is made to be conductive through heavy doping, and in the channel structure SCL1, the semiconductor material maintains the semiconductor property through light doping. In some embodiments, the channel structure SCL1 may be provided as a channel region of a thin film transistor and is overlapped with the gate of the thin film transistor, for example, overlapped with the gate layer GT; and the semiconductor conductive structure SCL2 may be connected to the source-drain metal layer SD or used for electrical connections between channel structures SCL1 of different thin film transistors. In other words, at least partial channel structures SCL1 are electrically connected to each other through the semiconductor conductive structure SCL2; and at least a portion of the semiconductor conductive structures SCL2 is connected to the source-drain metal layer SD through a via. However, when the semiconductor conductive structure SCL2 is required to transmit a large current, for example, when the light-emitting element LE is a Micro LED which requires the driving circuit PDC to provide a large driving current, the conductivity of the semiconductor conductive structure SCL2 is not sufficiently high, resulting in a large power consumption of the driving circuit PDC.

In other embodiments of the present disclosure, in the semiconductor layer SCL, a portion of or all of the semiconductor conductive structures may be replaced with a metal conductive structure to reduce the power consumption of the driving circuit PDC by using the superior conductivity of the metal material. The reduction in the power consumption of the driving circuit PDC will correspondingly reduce the heating of the driving circuit PDC, which can reduce the impact of heating on the characteristic of the thin film transistor and improve the display stability and the display effect. In these embodiments, the semiconductor layer SCL includes two or more host materials, where one of the host materials is a semiconductor material, and the other host material is a metal or an alloy. In some embodiments, the host material of the channel structure is a semiconductor material, and the host material of a portion of or all of the conductive structures is a metal or an alloy.

By way of example, in an embodiment of the present disclosure, referring to FIG. 27, FIG. 28-1, FIGS. 28-2, and FIG. 28-3, the semiconductor layer SCL includes a semiconductor structure SCLA and a metal conductive structure SCLB. The semiconductor structure SCLA includes a channel structure SCLA1, and at least partial channel structures SCLA1 are electrically connected to each other through the metal conductive structure SCLB. Furthermore, the semiconductor structure SCLA includes a channel structure SCLA1 and lap connection structures SCLA2 disposed on two sides of the channel structure SCLA1. The metal conductive structure SCLB is connected to the lap connection structure SCLA2 in a lapped manner. In this way, two channel structures SCLA1 can be electrically connected to each other through the metal conductive structure SCLB, thereby reducing the power consumption. Not only that, when the source-drain metal layer SD is connected to the semiconductor layer SCL, the source-drain metal layer SD is connected to the metal conductive structure SCLB. In this way, the ohmic contact resistance between the source-drain metal layer SD and the semiconductor layer SCL is reduced, which can reduce the power consumption. In this embodiment, the channel structure SCLA1 is provided overlapped with the gate layer GT and serves as the channel region of the thin film transistor, and maintains the semiconductor property. In this embodiment, the lap connection structure SCLA2 may maintain the semiconductor property or may be made to be conductive. As a preferred embodiment, the lap connection structure SCLA2 may be made to be conductive through heavy doping.

Optionally, the material of the metal conductive structure SCLB may be a metal or an alloy, or a stacked structure including a plurality of metal or alloy layers. By way of example, the material of the metal conductive structure SCLB is molybdenum, molybdenum alloy, copper, copper alloy, titanium, or titanium alloy.

Optionally, the thickness of the metal conductive structure SCLB may be substantially the same as the thickness of the semiconductor structure SCLA to reduce the segment difference of the semiconductor layer SCL itself.

Optionally, the metal conductive structure SCLB may be prepared by using an electron beam evaporation plating process to avoid damage to the semiconductor structure SCLA.

Optionally, a lift off process may be used to prepare the metal conductive structure SCLB. As follows, the process of preparing the semiconductor layer SCL is exemplarily described by taking the process exemplified in FIGS. 29 to 33 as examples.

Figure 29:
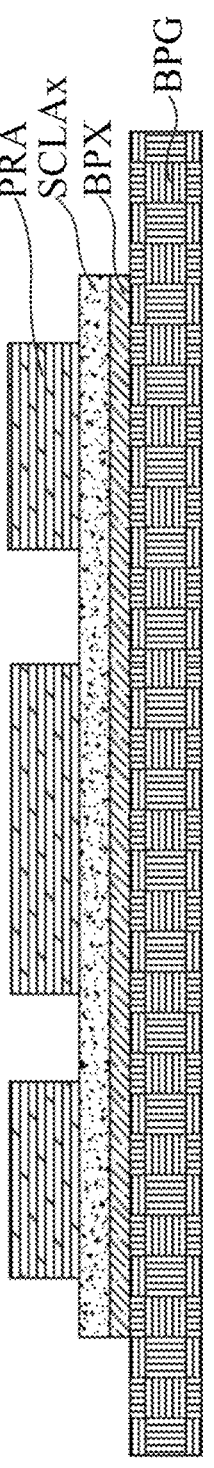
FIG. 29 is a schematic diagram of a structure in which a semiconductor material layer and a photoresist mask layer are sequentially prepared on a surface of a preparation substrate in an embodiment of the present disclosure.

Referring to FIG. 29, a semiconductor material layer SCLAx may be formed on a surface of a preparation substrate BPX. In some embodiments, the preparation substrate BPX is an intermediate substrate in the process of preparing the driving backplane DBP, and the intermediate substrate has already formed the film layers prior to the semiconductor layer SCL, and waits for further formation of the semiconductor layer SCL. In this example, the preparation substrate BPX may include the support substrate BPG, the first substrate BPA, the thick copper layer CL, the second substrate BPB, the first gate layer GT1, and the first gate insulating layer GI1 that are stacked in sequence. It can be understood that, when the structure of the driving backplane DBP is different, the preparation substrate in the present disclosure is different.

Referring to FIG. 29, after the semiconductor material layer SCLAx is formed, a photoresist mask layer PRA may be formed on the semiconductor material layer to define a pattern of the semiconductor structure SCLA.

Figure 30:
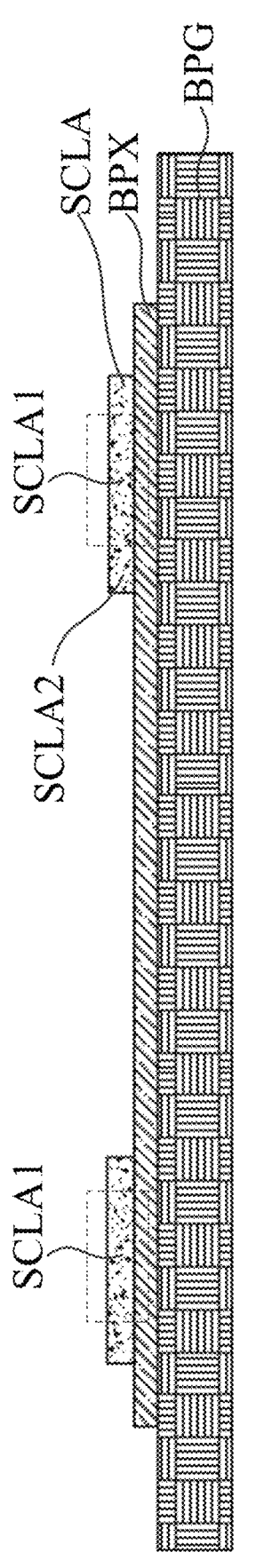
FIG. 30 is a schematic diagram of a structure in which a semiconductor structure is formed in an embodiment of the present disclosure.

Referring to FIG. 30, a patterning operation is continued to be performed on the semiconductor material layer SCLAx to obtain the semiconductor structure SCLA. Optionally, the semiconductor structure SCLA may be doped. Specifically, the channel structure SCLA1 is doped to adjust the threshold voltage of the thin film transistor; and the lap connection structure SCLA2 is doped to cause the lap connection structure SCLA2 to be conductive, thereby reducing the contact resistance between the lap connection structure SCLA2 and the metal conductive structure SCLB.

Figure 31:
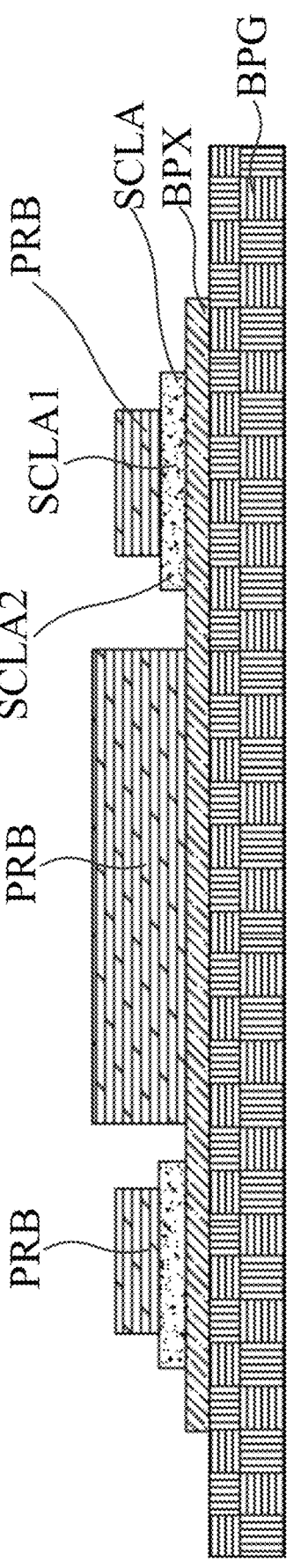
FIG. 31 is a schematic diagram of a structure in which a peelable adhesive pattern layer is formed in an embodiment of the present disclosure.

Referring to FIG. 31, after the semiconductor structure SCLA is obtained, a peelable adhesive pattern layer PRB may be formed on the surface of the base plate to define the pattern of the metal conductive structure SCLB.

Figure 32:
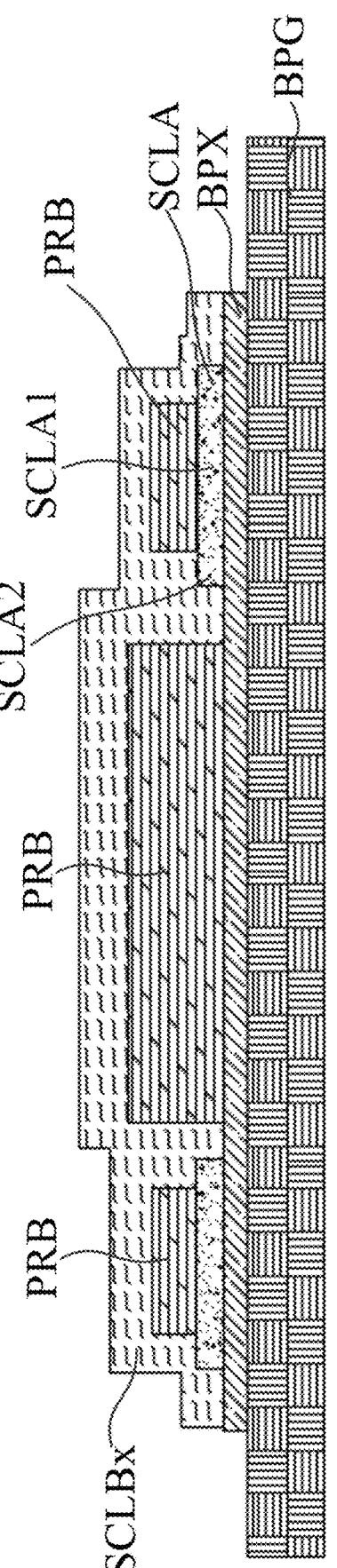
FIG. 32 is a schematic diagram of a structure in which a metal material layer is formed in an embodiment of the present disclosure.

Referring to FIG. 32, after the peelable adhesive pattern layer PRB is formed, a whole-surface metal material layer SCLBx may be formed through a process such as sputtering, evaporation plating (e.g., electron beam evaporation plating), or the like.

Figure 33:
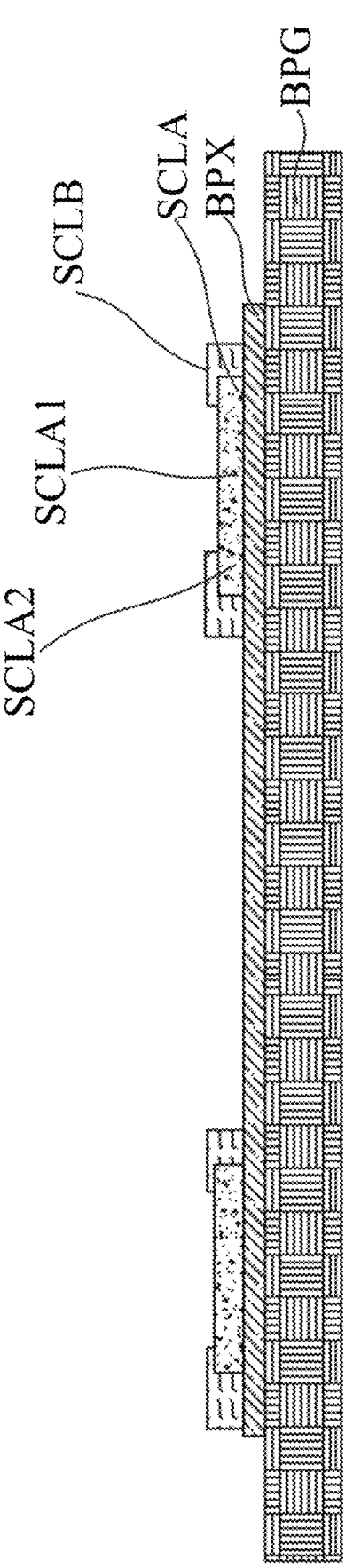
FIG. 33 is a schematic diagram of a structure in which a metal conductive structure is formed in an embodiment of the present disclosure.

Referring to FIG. 33, after the whole-surface metal material layer SCLBx is formed, the peelable adhesive pattern layer PRB is peeled off; and the metal material disposed on the peelable adhesive pattern layer PRB is removed, which causes the metal material layer SCLBx to be patterned to form the metal conductive structure SCLB.

In this way, in this embodiment, the semiconductor layer SCL includes two sub-layers, namely a semiconductor sub-layer and a metal sub-layer. In some embodiments, the semiconductor sub-layer forms the semiconductor structure SCLA, and the metal sub-layer forms the metal conductive structure SCLB. The metal conductive structure SCLB is connected to the lap connection structure SCLA2 of the semiconductor structure SCLA in a lapped manner, and the metal conductive structure SCLB exposes the channel structure SCLA1 of the semiconductor structure SCLA. Thereafter, the preparation of other film layers of the driving backplane DBP is continued, such as continuing the preparation of the second gate insulating layer GI2 on the surface of the semiconductor layer SCL.

In the above embodiment, the semiconductor layer SCL is composed of the semiconductor structure SCLA and the metal conductive structure SCLB; any one of the semiconductor structures SCLA includes a channel structure SCLA1 and lap connection structures SCLA2 disposed on two sides of the channel structure SCLA1; the lap connection structure SCLA2 is connected to the metal conductive structure SCLB in a lapped manner; and the metal conductive structure SCLB is configured to enable an electrical connection between the channel structures SCLA1, and is configured to be connected to the source-drain metal layer SD through a via.

In the above embodiment, when the channel regions of the two thin film transistors are electrically connected to each other through a conductive structure disposed in the semiconductor layer SCL, the conductive structure is the metal conductive structure SCLB. It can be understood that in some other embodiments of the present disclosure, a portion of the conductive structures may be a semiconductor conductive structure (where the host material of the semiconductor conductive structure is a semiconductor material, which is made to be conductive through heavy doping), and the rest of the conductive structures may be the metal conductive structure SCLB; or, in a same conductive structure, a certain portion or certain portions of the conductive structure is made of a metal material, and the rest is made of a semiconductor material that is made to be conductive.

In the above embodiment, when the source-drain metal layer SD is connected to the semiconductor layer SCL through a via, the source-drain metal layer SD is connected to the metal conductive structure SCLB disposed in the semiconductor layer SCL through the via. It can be understood that in some other embodiments of the present disclosure, when the source-drain metal layer SD is connected to a conductive structure disposed in the semiconductor layer SCL through a via, the conductive structure may also be a semiconductor conductive structure; or a portion of the conductive structures is the metal conductive structure SCLB, and a portion of the conductive structures is a semiconductor conductive structure.

In the above embodiment, in the semiconductor layer SCL, the metal conductive structure SCLB is connected to, in a lapped manner, a surface of the semiconductor structure SCLA away from the first substrate BPA. In other words, in preparation, the semiconductor sub-layer is prepared first and then the metal sub-layer is prepared. In some other embodiments of the present disclosure, the metal sub-layer may also be prepared first and then the semiconductor sub-layer is prepared. In this way, the lap connection structure SCLA2 of the semiconductor structure SCLA is connected to, in a lapped manner, the surface of the metal conductive structure SCLB away from the first substrate BPA.

Figure 34:
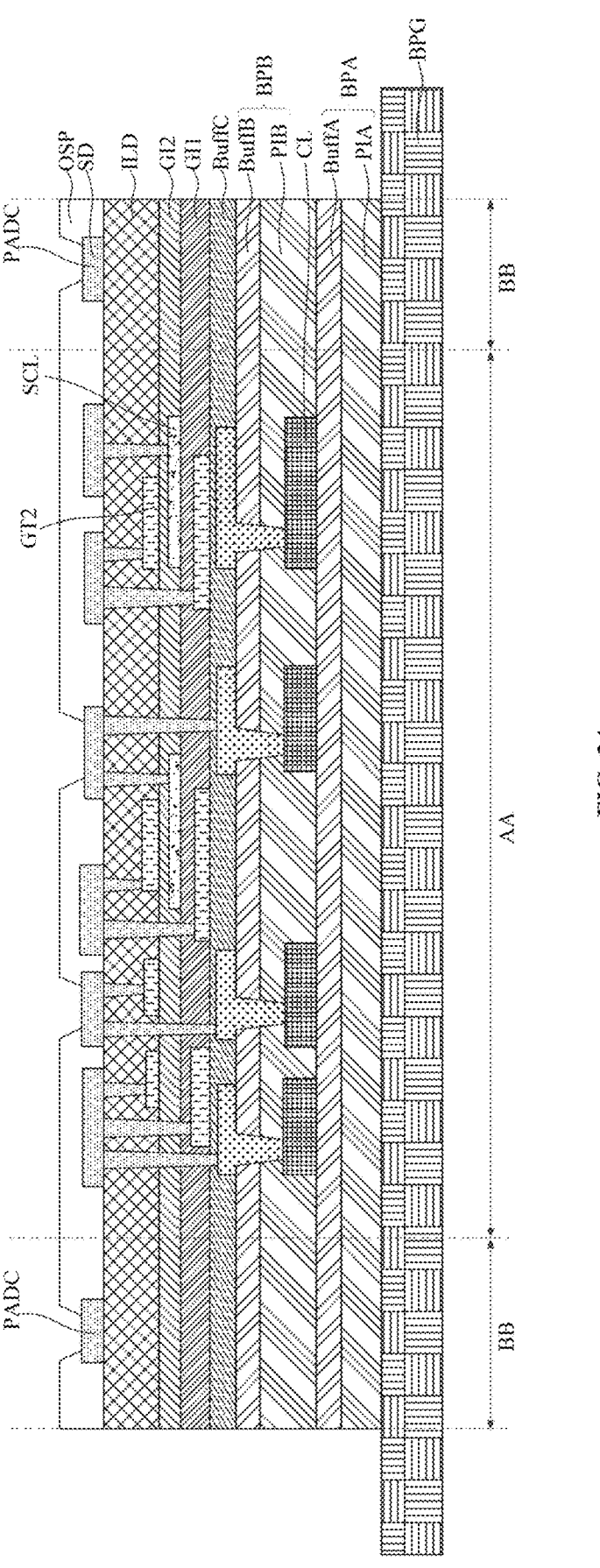
FIG. 34 is a schematic diagram of a structure in which a driving backplane includes a display area and a peripheral area in an embodiment of the present disclosure.

In an embodiment of the present disclosure, referring to FIG. 34, the driving backplane DBP may include a display area AA and a peripheral area BB located on at least one side of the display area AA, such as the peripheral area BB surrounding the display area AA. In some embodiments, the light-emitting element LE may be bound in the display area AA for display. The peripheral area BB may be provided with a binding pad PADC, and the binding pad PADC may be configured to be electrically connected to an external driving circuit, e.g., electrically connecting to a flexible circuit board, a driving circuit board, or a driving chip.

Figure 35:
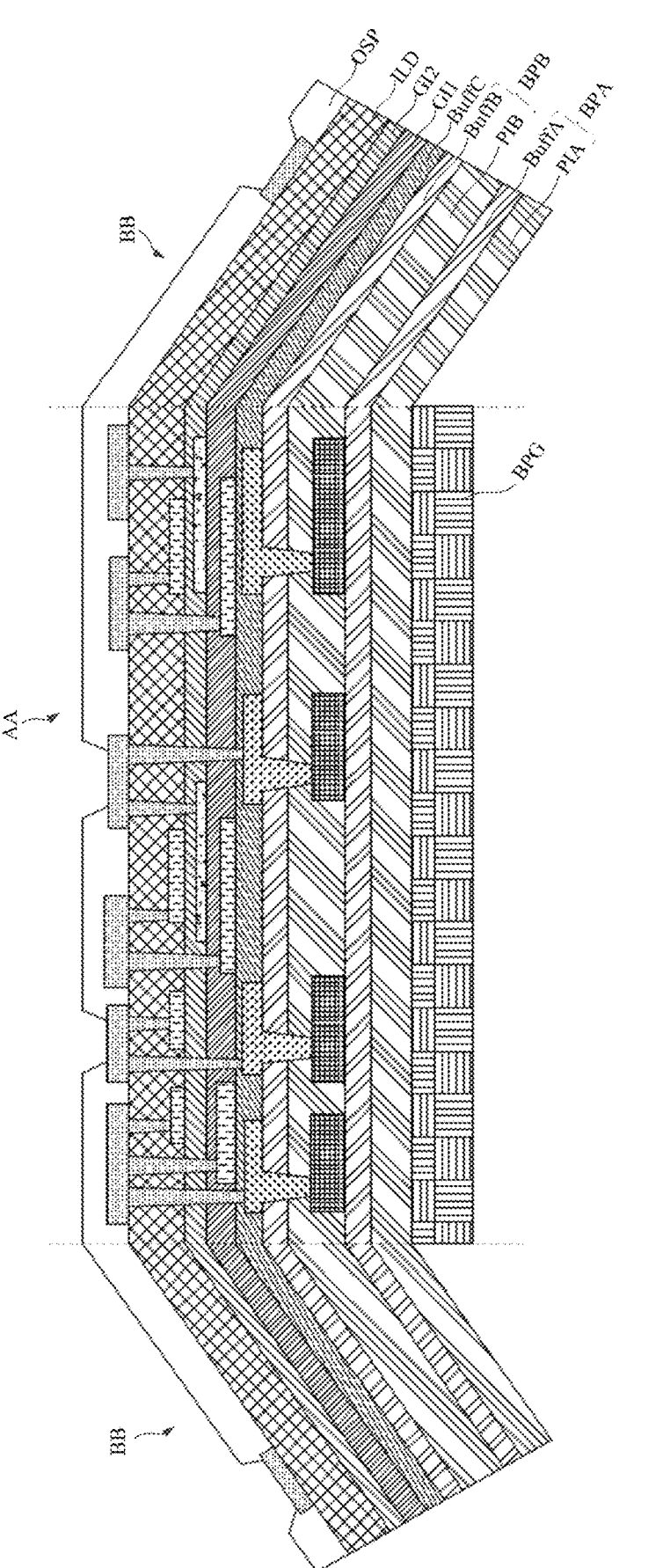
FIG. 35 is a schematic diagram of a structure in which a driving backplane is bendable in a peripheral area in an embodiment of the present disclosure.
Figure 36:
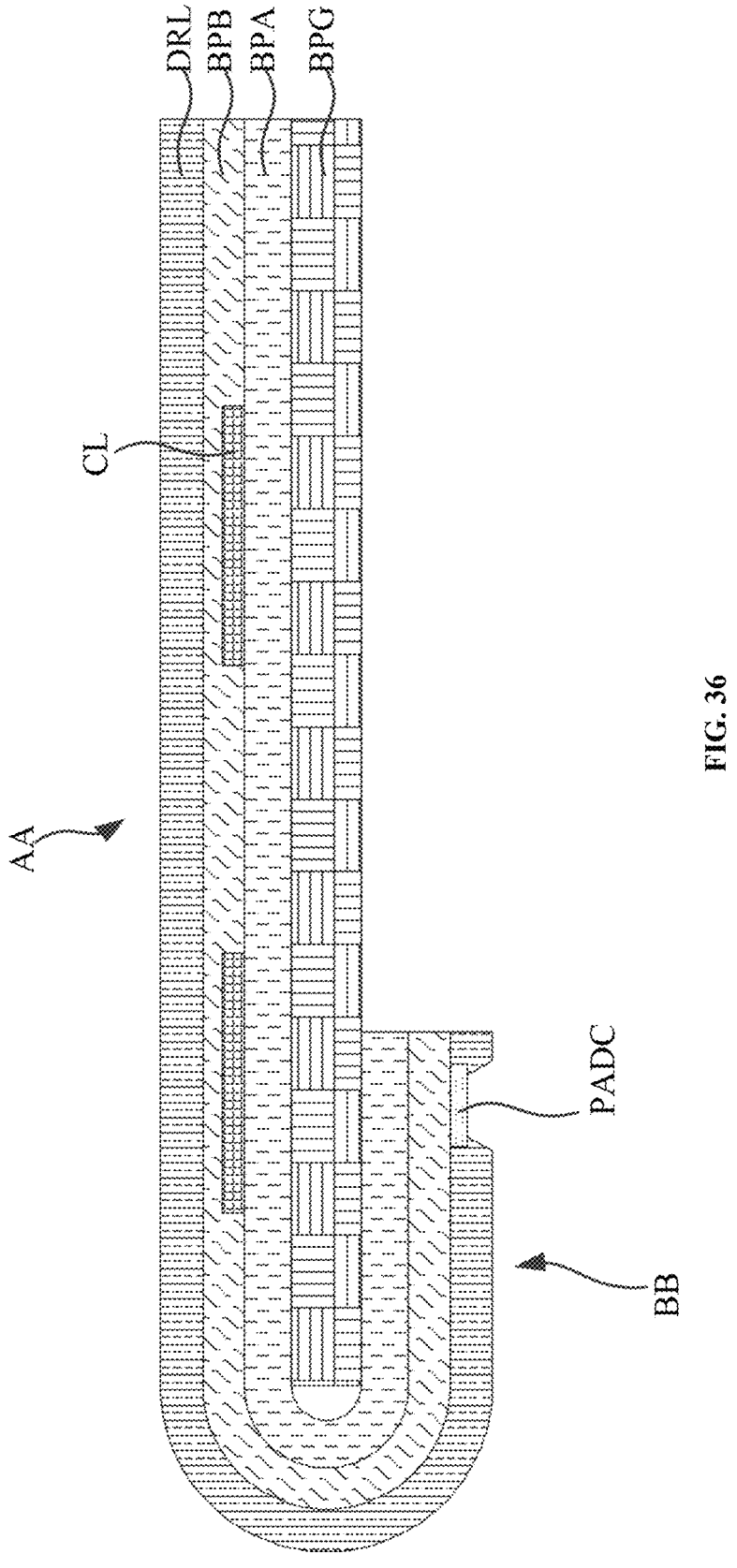
FIG. 36 is a schematic diagram of a structure in which a binding pad is bent to a back surface of a driving backplane in an embodiment of the present disclosure.

Optionally, referring to FIGS. 35 and 36, the support substrate BPG of the driving backplane DBP may be partially removed, enabling the driving backplane DBP to retain the support substrate BPG only in the display area AA. In this way, the driving backplane DBP has a flexibility in the peripheral area BB and the peripheral area BB can be bent to the back surface of the driving backplane DBP, which causes the binding pad PADC to be bent to the back surface of the driving backplane DBP together. This setting manner facilitates the mutual connection between the driving backplane DBP and the light-emitting base plate, and can reduce the size of the connection seam to achieve the effect of seamless connection or narrow seam connection. In this way, a large-sized panel can be connected by using a small-sized light-emitting base plate, reducing the difficulty of preparing the large-sized panel.

Optionally, the peeling off of a portion of the support substrate BPG may be accomplished through a laser peeling off process, such as removing the support substrate BPG located in the peripheral area BB through the laser peeling off process.

Optionally, the binding pad PADC is provided in the source-drain metal layer SD. The thick copper layer CL may not be provided in at least a partial region of the peripheral area BB, for example, the entire peripheral area BB is not provided with the thick copper layer C. The binding pad PADC is connected to the thick copper layer CL in the display area AA through a connection wire disposed in the source-drain metal layer SD. In this way, a decrease in the yield rate during the laser peeling off due to the provision of the thick copper layer CL in the peripheral area BB can be avoided. As an example, in the peripheral area BB, the source-drain metal layer SD is provided with a binding pad PADC and a connection wire connected to the binding pad PADC, where the connection wire extends to the display area AA and then is electrically connected to the thick copper layer CL.

Optionally, the peripheral area BB may include a binding zone and a bending zone, and the bending zone is located between the binding zone and the display area AA. In some embodiments, the binding pad PADC is provided in the binding zone, and the bending zone is thinned (in particular, the inorganic material is reduced) to reduce the bending radius. In bending, the driving backplane DBP may be made to bend in the bending zone, thereby bending the binding zone to the back surface of the driving backplane DBP.

After considering the specification and practicing the invention disclosed herein, those skilled in the art will easily come up with other implementation solutions of the present disclosure. The purpose of the present disclosure is to cover any variations, uses or adaptations of the present disclosure, and these variations, uses or adaptations follow the general principles of the present disclosure and include common knowledge or commonly used technical means in the technical field that are not disclosed in the present disclosure. The specification and embodiments are only considered exemplary, and the true scope and spirit of the present disclosure are indicated by the accompanying claims.

What is claimed is:

1. A driving backplane, comprising a first substrate, a copper layer, a second substrate, and a driving layer that are stacked in sequence; wherein the copper layer is disposed on a surface of the first substrate, the second substrate is disposed on a side of the copper layer away from the first substrate, the driving layer is disposed on a side of the second substrate away from the copper layer, the copper layer is provided with a driving wire configured to load a driving signal; the driving layer is provided with a driving circuit configured to drive a light-emitting element; and the driving circuit is electrically connected to the driving wire through a via;

wherein the driving layer comprises a transistor layer, an interlayer dielectric layer and a source-drain metal layer stacked in sequence on a side of the second substrate away from the first substrate; and the source-drain metal layer is electrically connected, through a via, to the copper layer in a direct manner or an indirect manner.

2. The driving backplane according to claim 1, wherein the second substrate comprises a second polyimide layer covering the copper layer, and a second inorganic barrier layer disposed on a side of the second polyimide layer away from the first substrate.

3. The driving backplane according to claim 2, wherein a thickness of the second polyimide layer is greater than a thickness of the copper layer.

4. The driving backplane according to claim 1, wherein the thickness of the copper layer is in a range of 0.2~20 microns.

5. The driving backplane according to claim 1, wherein the first substrate comprises a first polyimide layer and a first inorganic barrier layer arranged in a stacking manner, and the copper layer is disposed on a surface of the first inorganic barrier layer away from the first polyimide layer.

6. The driving backplane according to claim 1, wherein the driving wire comprises a driving voltage wire configured to load a driving voltage, and a reference voltage wire configured to load a reference voltage;

the source-drain metal layer is provided with a first device pad, a second device pad, a first connection structure, and a second connection structure; and the driving circuit is electrically connected to the first connection structure, and the first connection structure is electrically connected to the driving voltage wire; the first device pad is electrically connected to an output end of the driving circuit; and the second device pad is electrically connected to the second connection structure, and the second connection structure is electrically connected to the reference voltage wire.

7. The driving backplane according to claim 1, wherein the transistor layer comprises transistors; at least a portion of the transistors is provided with a top gate and a bottom gate; and the top gate and the bottom gate of the transistor are electrically connected to each other through the source-drain metal layer.

8. The driving backplane according to claim 1, wherein the driving backplane is provided with an adapter pad between the source-drain metal layer and the copper layer; a first portion of the adapter pad is electrically connected to the copper layer through a via; and a second portion of the adapter pad is electrically connected to the source-drain metal layer through another via.

9. The driving backplane according to claim 8, wherein the driving backplane further comprises an adapter layer and a third inorganic barrier layer stacked in sequence on the side of the second substrate away from the first substrate; and the transistor layer is disposed on a side of the third inorganic barrier layer away from the first substrate; and the adapter pad is provided in the adapter layer.

10. The driving backplane according to claim 1, wherein the transistor layer comprises a semiconductor layer; and the semiconductor layer comprises channel structures and semiconductor conductive structures; and at least partial ones of the channel structures are electrically connected to each other through the semiconductor conductive structure; and at least a portion of the semiconductor conductive structures is connected to the source-drain metal layer through a via.

11. The driving backplane according to claim 1, wherein the transistor layer comprises a semiconductor layer; and the semiconductor layer comprises semiconductor structures and metal conductive structures; and the semiconductor structures comprise channel structures, at least partial ones of the channel structures are electrically connected to each other through the metal conductive structure.

12. The driving backplane according to claim 11, wherein at least a portion of the semiconductor structures comprises lap connection structures disposed on two sides of the channel structure; and the lap connection structure is connected to the metal conductive structure in a lapped manner; or at least a portion of the metal conductive structures is connected to the source-drain metal layer through a via.

13. The driving backplane according to claim 11, wherein the semiconductor layer is composed of the semiconductor structures and the metal conductive structures; any one of the semiconductor structures is composed of a channel structure and lap connection structures disposed on two side of the channel structure; and the lap connection structure is connected to the metal conductive structure in a lapped manner; and the metal conductive structure is configured to enable an electrical connection between the channel structures, and is configured to be connected to the source-drain metal layer through a via.

14. The driving backplane according to claim 1, wherein the driving backplane comprises a display area and a peripheral area located on at least one side of the display area; and the copper layer is not provided in the peripheral area.

15. The driving backplane according to claim 14, wherein the driving backplane further comprises a support substrate, the first substrate is disposed on a side of the support substrate away from the peripheral area, and the support substrate is not provided in at least a partial region of the peripheral area.

16. The driving backplane according to claim 15, wherein the support substrate is not provided in the peripheral area; and the peripheral area is capable of bending to a back surface of the driving backplane; or the source-drain metal layer is provided with a binding pad and a connection wire; the binding pad is disposed in the peripheral area; and the connection wire is electrically connected to the binding pad and extends to the display area, and is electrically connected to the copper layer through a via.

17. A light-emitting base plate, comprising the driving backplane according to claim 1, and comprising an electronic element; wherein the electronic element is electrically connected to the driving layer of the driving backplane; and the electronic element comprises the light-emitting element.

18. A display panel, comprising a driving backplane and a light-emitting element, wherein the driving backplane comprises a first substrate, a copper layer, a second substrate, and a driving layer that are stacked in sequence; wherein the copper layer is disposed on a surface of the first substrate, the second substrate is disposed on a side of the copper layer away from the first substrate, the driving layer is disposed on a side of the second substrate away from the copper layer, the copper layer is provided with a driving wire configured to load a driving signal; the driving layer is provided with a driving circuit configured to drive the light-emitting element; and the driving circuit is electrically connected to the driving wire through a via; and the light-emitting element is electrically connected to the driving layer of the driving backplane;

wherein the driving layer comprises a transistor layer, an interlayer dielectric layer and a source-drain metal layer stacked in sequence on a side of the second substrate away from the first substrate; and the source-drain metal layer is electrically connected, through a via, to the copper layer in a direct manner or an indirect manner.

19. A display apparatus, comprising a driving backplane, wherein the driving backplane comprises a first substrate, a copper layer, a second substrate, and a driving layer that are stacked in sequence; wherein the copper layer is disposed on a surface of the first substrate, the second substrate is disposed on a side of the copper layer away from the first substrate, the driving layer is disposed on a side of the second substrate away from the copper layer, the copper layer is provided with a driving wire configured to load a driving signal; the driving layer is provided with a driving circuit configured to drive a light-emitting element; and the driving circuit is electrically connected to the driving wire through a via;

wherein the driving layer comprises a transistor layer, an interlayer dielectric layer and a source-drain metal layer stacked in sequence on a side of the second substrate away from the first substrate; and the source-drain metal layer is electrically connected, through a via, to the copper layer in a direct manner or an indirect manner.

* * * * *